United States Patent
Niimura et al.

(10) Patent No.: US 9,887,260 B2
(45) Date of Patent: Feb. 6, 2018

(54) SEMICONDUCTOR DEVICE AND SEMICONDUCTOR DEVICE MANUFACTURING METHOD

(71) Applicant: FUJI ELECTRIC CO., LTD., Kawasaki-shi (JP)

(72) Inventors: Yasushi Niimura, Matsumoto (JP); Toshiaki Sakata, Matsumoto (JP); Shunji Takenoiri, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/068,534

(22) Filed: Mar. 11, 2016

(65) Prior Publication Data
US 2016/0293693 A1  Oct. 6, 2016

(30) Foreign Application Priority Data
Apr. 2, 2015 (JP) ................................. 2015-076124

(51) Int. Cl.
*H01L 29/06* (2006.01)
*H01L 21/266* (2006.01)

(52) U.S. Cl.
CPC ........ *H01L 29/0634* (2013.01); *H01L 21/266* (2013.01)

(58) Field of Classification Search
CPC ............. H01L 2924/00; H01L 29/0634; H01L 29/0696; H01L 29/7811; H01L 29/1095; H01L 29/0878
USPC ............. 257/E29.257, E29.262, 329, E21.41
See application file for complete search history.

(56) References Cited

U.S. PATENT DOCUMENTS

| | | | |
|---|---|---|---|
| 6,551,909 B1 | 4/2003 | Fujihira | |
| 7,235,841 B2 * | 6/2007 | Onishi | H01L 29/0634 257/328 |
| 8,217,454 B2 * | 7/2012 | Lin | H01L 29/0634 257/342 |
| 2002/0171093 A1 | 11/2002 | Onishi et al. | |
| 2006/0033153 A1 * | 2/2006 | Onishi | H01L 29/0634 257/328 |
| 2008/0290403 A1 | 11/2008 | Ono et al. | |
| 2011/0204442 A1 * | 8/2011 | Guan | H01L 29/0634 257/342 |

(Continued)

FOREIGN PATENT DOCUMENTS

| | | |
|---|---|---|
| JP | 2000-040822 A | 2/2000 |
| JP | 2002-280555 A | 9/2002 |

(Continued)

*Primary Examiner* — David Vu
*Assistant Examiner* — Jonathan Han
(74) *Attorney, Agent, or Firm* — Rabin & Berdo, P.C.

(57) ABSTRACT

A first parallel pn layer in which first n-type regions and first p-type regions are disposed in a plan view layout of stripes in an element active portion. A second parallel pn layer has a plan view layout of stripes oriented in the same direction as that of the stripes of the first parallel pn layer in a breakdown voltage structure portion. Corner portions of the first parallel pn layer has a plan view shape where stepped regions formed by shortening the length of the first n-type and p-type regions in steps are disposed in a stepwise arrangement. The stepped regions continue with a second parallel pn layer via an intermediate region lower in average impurity concentration than the first parallel pn layer.

8 Claims, 16 Drawing Sheets

(56) References Cited

U.S. PATENT DOCUMENTS

| | | | |
|---|---|---|---|
| 2011/0241110 A1* | 10/2011 | Xiao | ............... H01L 29/0634 |
| | | | 257/339 |
| 2013/0099347 A1 | 4/2013 | Tamura et al. | |
| 2014/0035002 A1 | 2/2014 | Cao et al. | |
| 2014/0117437 A1 | 5/2014 | Willmeroth et al. | |
| 2014/0197477 A1* | 7/2014 | Onishi | ............ H01L 29/7811 |
| | | | 257/329 |
| 2016/0104768 A1 | 4/2016 | Willmeroth et al. | |

FOREIGN PATENT DOCUMENTS

| | | |
|---|---|---|
| JP | 2008-294214 A | 12/2008 |
| JP | 2011-192824 A | 9/2011 |
| JP | 2012-160752 A | 8/2012 |
| JP | 2013-089921 A | 5/2013 |
| WO | WO-2013/008543 A1 | 1/2013 |

\* cited by examiner

SEMICONDUCTOR DEVICE AND SEMICONDUCTOR DEVICE MANUFACTURING METHOD

CROSS-REFERENCE TO RELATED APPLICATION

This application is based on, and claims priority to, Japanese Patent Application No. 2015-076124, filed on Apr. 2, 2015, the contents of which are entirely incorporated herein by reference.

BACKGROUND OF THE INVENTION

1. Field of the Invention

The present invention relates to a semiconductor device and a semiconductor device manufacturing method.

2. Description of the Background Art

Heretofore, a semiconductor device (hereafter referred to as a super junction semiconductor device) including a super junction (SJ) structure with a drift layer as a parallel pn layer wherein n-type regions and p-type regions increased in impurity concentration are alternately disposed in a direction (a horizontal direction) parallel to a chip principal surface, is publicly known. In the super junction semiconductor device, current flows through the n-type regions of the parallel pn layer when in on-state, while a depletion layer also extends from the pn junction between the n-type regions and p-type regions of the parallel pn layer when in off-state, and the n-type regions and the p-type regions are depleted, thus bearing a breakdown voltage. Also, with the super junction semiconductor device, as it is possible to increase the impurity concentration of the drift layer, it is possible to reduce on-resistance while maintaining a high breakdown voltage.

As this kind of super junction semiconductor device, a device including a parallel pn layer wherein n-type regions and p-type regions are disposed in a plan view layout of stripes extending with the same width all over from an element active portion to a breakdown voltage structure portion, is proposed (for example, refer to JP-A-2008-294214 (Paragraph 0020 and FIGS. 1 and 2)). In JP-A-2008-294214, the breakdown voltage of the breakdown voltage structure portion is set to be higher than the breakdown voltage of the element active portion by setting the impurity concentration of the parallel pn layer in the breakdown voltage structure portion to be lower than the impurity concentration of the parallel pn layer in the element active portion. The element active portion is a region through which current flows when in on-state. An element peripheral portion encompasses the element active portion. The breakdown voltage structure portion is disposed in the element peripheral portion and is a region which relaxes the electric field on a chip front surface side and holds the breakdown voltage.

Also, as another super junction semiconductor device, a device wherein the repeated pitch of n-type regions and p-type regions of a parallel pn layer is set to be narrower in a breakdown voltage structure portion than in an element active portion, is proposed (for example, refer to JP-A-2002-280555 (Paragraph 0023 and FIG. 6), WO2013/008543 (Paragraph 0032 and FIGS. 1 and 2), and JP-A-2013-089921 (Paragraph 0023 and FIGS. 2, 3, and 5)). In JP-A-2002-280555, a parallel pn layer in which the n-type regions and the p-type regions are disposed in a plan view layout of stripes is provided in each of the element active portion and breakdown voltage structure portion. In WO2013/008543, the parallel pn layer in which the n-type regions and the p-type regions are disposed in the plan view layout of stripes is provided in the element active portion, and a parallel pn layer wherein the p-type regions are disposed in the n-type region in a plan view layout of matrix is provided in the breakdown voltage structure portion.

In JP-A-2013-089921, the n-type regions and the p-type regions are disposed in a plan view layout of stripes in each of the element active portion and breakdown voltage structure portion, and in each of corner portions (portion equivalent to the vertices of a rectangle) of the element active portion having a substantially rectangular plan view shape, the length of the n-type regions and p-type regions in a direction in which the stripes of the parallel pn layer extend is shortened in steps so as to follow the curvature of the corner portion of the element active portion. Also, as another super junction semiconductor device, a device wherein n-type regions and p-type regions of a parallel pn layer are disposed in a plan view layout of stripes, and in the vicinity of the boundary between an element active portion and a breakdown voltage structure portion, the width of the p-type regions of the parallel pn layer in the element active portion is gradually narrowed toward the outer side, is proposed (for example, refer to JP-A-2012-160752 (Paragraph 0051 and FIGS. 18 and 19)).

In JP-A-2002-280555, WO2013/008543, JP-A-2013-089921, and JP-A-2012-160752, in the element active portion and breakdown voltage structure portion, the impurity concentration of the parallel pn layer in the breakdown voltage structure portion is set to be lower than the impurity concentration of the parallel pn layer in the element active portion by changing the repeated pitch of the n-type regions and p-type regions of the parallel pn layer and the width of the p-type regions of the parallel pn layer. Therefore, the breakdown voltage of the breakdown voltage structure portion is higher than the breakdown voltage of the element active portion, in the same way as in JP-A-2008-294214.

As a method of forming the parallel pn layer, a method whereby n-type impurities are ion implanted all over each time a non-doped layer is stacked by epitaxial growth, and after p-type impurities are selectively ion implanted using a resist mask, the impurities are diffused by heat treatment, is proposed (for example, refer to JP-A-2011-192824 (Paragraph 0025 and FIGS. 1 to 4)). In JP-A-2011-192824, with the subsequent thermal diffusion step taken into account, the width of openings of the resist mask used to ion implant the p-type impurities is set to be on the order of ¼ of the width of the rest, in response to which the amount of p-type impurities implanted is set to be on the order of four times the amount of n-type impurities implanted, thereby equalizing the total impurity amount in the n-type regions to that in the p-type regions of the parallel pn layer.

As another method of forming the parallel pn layer, a method whereby after each of n-type and p-type impurities is selectively ion implanted using a different resist mask each time an n-type high resistance layer is stacked by epitaxial growth, the impurities are diffused by heat treatment, is proposed (for example, refer to JP-A-2000-040822 (Paragraphs 0032 to 0035 and FIG. 4)). In JP-A-2000-040822, n-type impurity implantation regions forming the n-type regions of the parallel pn layer and p-type impurity implantation regions forming the p-type regions are selectively formed so as to be opposed to each other in the horizontal direction, and are thermally diffused. Therefore, it is possible to increase the impurity concentration of both the n-type regions and p-type regions, and it is possible to suppress the variation in impurity concentration in the vicinity of the pn junction between regions adjacent in the horizontal direction.

However, as a result of the inventors' keenly repeated researches, it is newly revealed that the following problems arise when the parallel pn layer is formed in the element active portion and breakdown voltage structure portion by selectively ion implanting each of n-type and p-type impurities, as in JP-A-2000-040822. FIGS. 16A, 16B, 17A, and 17B are plan views showing a plan view layout of a parallel pn layer of a heretofore known super junction semiconductor device. FIGS. 16A and 17A show a plan view layout of a parallel pn layer, when completed, in the vicinity of a corner portion of a first parallel pn layer 104. FIGS. 16A and 17A show a ¼ portion of the heretofore known super junction semiconductor device. FIGS. 16B and 17B show a condition of the parallel pn layer in the process of being formed, respectively, in the rectangular frames AA and BB of FIGS. 16A and 17A. The parallel pn layer in each of the rectangular frames AA and BB is a parallel pn layer in a boundary region 100b between an element active portion 100a and a breakdown voltage structure portion 100c. An element peripheral portion 100d is configured of the boundary region 100b and breakdown voltage structure portion 100c. In FIGS. 16A, 16B, 17A, and 17B, a horizontal direction (hereafter referred to as a first direction) in which the stripes of the parallel pn layer extend is taken as y, and a horizontal direction (hereafter referred to as a second direction) perpendicular to the stripes is taken as x. Sign 101 is an n⁻-type semiconductor layer which is epitaxially grown to form the parallel pn layer.

As shown in FIGS. 16A and 17A, in the heretofore known super junction semiconductor device, the parallel pn layer (hereafter referred to as the first parallel pn layer) 104 of the element active portion 100a and a parallel pn layer (hereafter referred to as a second parallel pn layer) 114 of the breakdown voltage structure portion 100c both extend, and are in contact with each other, in the boundary region 100b between the element active portion 100a and the breakdown voltage structure portion 100c. As shown in FIGS. 16B and 17B, when forming the first and second parallel pn layers 104 and 114, n-type impurity implantation regions 121 forming first n-type regions 102 of the first parallel pn layer 104 and p-type impurity implantation regions 122 forming first p-type regions 103 are formed so as to extend in a first region 100e on the inner side (the element active portion 100a side) of the boundary region 100b. n-type impurity implantation regions 131 and 141 forming second n-type regions 112 and 115 of the second parallel pn layer 114 and p-type impurity implantation regions 132 and 142 forming second p-type regions 113 and 116 are formed so as to extend in a second region 100f on the outer side (the breakdown voltage structure portion 100c side) of the boundary region 100b. All the impurity implantation regions extend to the boundary between the first region 100e and the second region 100f. Sign 117 is a channel stopper region provided in the terminal region of the breakdown voltage structure portion 100c.

As shown in FIGS. 16A and 16B, when setting the first n-type regions 102 and first p-type regions 103 of the first parallel pn layer 104 and the second n-type regions 112 and second p-type regions 113 of the second parallel pn layer 114 to identical repeated pitches P11 and P12 (P11=P12), the respective regions of the first and second parallel pn layers 104 and 114 attain a condition in which the same conductivity types of regions of the two parallel pn layers are in contact with each other. That is, the n-type impurity implantation regions 121 and 131 forming the first and second n-type regions 102 and 112, as well as the p-type impurity implantation regions 122 and 132 forming the first and second p-type regions 103 and 113, are disposed in a plan view layout of stripes continuing all over from the element active portion 100a to the breakdown voltage structure portion 100c. Therefore, the charge balance between the first and second parallel pn layers 104 and 114 is never lost in the boundary region 100b, but as the first and second parallel pn layers 104 and 114 both have the same impurity concentration, no difference in breakdown voltage occurs between the element active portion 100a and the breakdown voltage structure portion 100c. Consequently, there is the problem that electric field is likely to concentrate locally in the breakdown voltage structure portion 100c, and that the breakdown voltage of the whole element is determined by the breakdown voltage of the breakdown voltage structure portion 100c.

Meanwhile, as shown in FIGS. 17A and 17B, when setting the repeated pitch P12 of the second n-type regions 115 and second p-type regions 116 to be narrower than the repeated pitch P11 of the first n-type regions 102 and first p-type regions 103 (P11>P12), the n-type impurity concentration or the p-type impurity concentration increases partially in the boundary region 100b. For example, in JP-A-2013-089921, in the corner portion of the first parallel pn layer 104, a portion 143, in which the length in the first direction y (hereafter referred to simply as the length) of the n-type impurity implantation regions 121 and p-type impurity implantation regions 142 of the first parallel pn layer 104 is shortened in steps, attains a condition in which an n-type impurity implantation region and a p-type impurity implantation region, which are different in the width in the second direction (hereafter referred to simply as the width), are adjacent to each other in the second direction x. For example, when the condition is attained in which the n-type impurity implantation region 121 and the p-type impurity implantation region 142 are adjacent to each other in the second direction x, as shown in FIG. 17B, the n-type impurity concentration of this portion becomes higher than the p-type impurity concentration. In this way, there is the problem that it is difficult, in the corner portion of the first parallel pn layer 104, to secure the charge balance in the boundary between the first parallel pn layer 104 and the second parallel pn layer 114, and that the breakdown voltage of the boundary region 100b drops partially. It is possible to suppress the partial drop in breakdown voltage due to a relative reduction in the impurity concentration of the first and second parallel pn layers 104 and 114, but the above problem leads to a drop in the breakdown voltage of the whole element.

SUMMARY OF THE INVENTION

In order to solve the problems of the heretofore described heretofore known technologies, the invention has for its object to provide a semiconductor device, and a semiconductor device manufacturing method, which can reduce on-resistance and suppress a drop in breakdown voltage.

In order to solve the heretofore described problems and achieve the object of the invention, a semiconductor device according to an aspect of the invention has the following features. A surface element structure is provided on the side of a first principal surface. A low resistance layer is provided on the side of a second principal surface. A first parallel pn layer is provided between the surface element structure and the low resistance layer, and a second parallel pn layer is provided so as to encompass the first parallel pn layer. In the first parallel pn layer, first first conductivity type regions and first second conductivity type regions are alternately disposed in a direction parallel to the first principal surface. In the second parallel pn layer, second first conductivity type regions and second second conductivity type regions are alternately disposed, in the direction parallel to the first principal surface, at a pitch narrower than the repeated pitch of the first first conductivity type regions and first second conductivity type regions. The first first conductivity type regions and the first second conductivity type regions are disposed in a plan view layout of stripes. The plan view shape of the first parallel pn layer has a rectangle having corner portions, each of which is of a stepwise arrangement wherein the length in a first direction of the first first conductivity type regions and first second conductivity type regions, in which the first first and first second conductivity type regions extend in stripes, is shortened in steps. The first first conductivity type region or the first second conductivity type region includes a first portion, having a stepped shape, which is adjacent to the second first conductivity type region or second second conductivity type region so as to be parallel to the first direction, and a second portion opposed to the second second conductivity type region or second first conductivity type region in a second direction perpendicular to the first direction. The width of the first portion in the second direction is narrower than the width of the second portion.

Also, the semiconductor device according to the invention is such that in the aspect of the invention, the first portion is adjacent to a region, of the second first conductivity type region and second second conductivity type region configuring the second parallel pn layer, which is different in conductivity type from the first portion.

Also, the semiconductor device according to the invention is such that in the aspect of the invention, the first portion includes a first recess portion wherein a second portion side portion of the first portion is narrower in width than the other portion of the first portion.

Also, the semiconductor device according to the invention is such that in the aspect of the invention, the first portion is in contact in the first direction with a region, of the second first conductivity type region and second second conductivity type region configuring the second parallel pn layer, which is of the same conductivity type as that of the first portion. The region of the same conductivity type includes a second recess portion wherein a first portion side portion of the region of the same conductivity type is narrower in width than the other portion of the region of the same conductivity type.

Also, the semiconductor device according to the invention is such that in the aspect of the invention, the length of the first first conductivity type regions and first second conductivity type regions is shortened in steps each time the first first conductivity type region and the first second conductivity type region are each repeated by two or more pitches in the corner portion of the first parallel pn layer.

Also, the semiconductor device according to the invention is such that in the aspect of the invention, the second first conductivity type regions and the second second conductivity type regions are disposed in a plan view layout of stripes orientated in the same direction as that of the stripes of the first first conductivity type regions and second first conductivity type regions.

Also, the semiconductor device according to the invention is such that in the aspect of the invention, an intermediate region is provided between the opposing first parallel pn layer and second parallel pn layer. The intermediate region has third first conductivity type regions and third second conductivity type regions, which are provided so as to be in contact with the first parallel pn layer, and fourth first conductivity type regions and fourth second conductivity type regions, which are provided so as to be in contact with the second parallel pn layer. The third first conductivity type regions are lower in average impurity concentration than the first first conductivity type regions. The third second conductivity type regions are lower in average impurity concentration than the first second conductivity type regions. The fourth first conductivity type regions are lower in average impurity concentration than the second first conductivity type regions. The fourth second conductivity type regions are lower in average impurity concentration than the second second conductivity type regions. The first portion is in contact with the second parallel pn layer in the second direction via the intermediate region.

Also, the semiconductor device according to the invention is such that in the aspect of the invention, the surface element structure and the first parallel pn layer are disposed in an element active portion through which current flows when in on-state. The second parallel pn layer is disposed in an element peripheral portion which encompasses the element active portion.

Also, in order to solve the heretofore described problems and achieve the object of the invention, a semiconductor device manufacturing method according to an aspect of the invention has the following features. Firstly, a formation step which repeatedly carries out first and second steps is carried out. In the first step, a first conductivity type semiconductor layer is deposited. In the second step, first first conductivity type impurity implantation regions, first second conductivity type impurity implantation regions, second first conductivity type impurity implantation regions, and second second conductivity type impurity implantation regions are formed in a surface layer of the first conductivity type semiconductor layer. The first first conductivity type and the first second conductivity type impurity implantation regions are alternately disposed in a direction parallel to a surface of the first conductivity type semiconductor layer. The second first conductivity type and the second second conductivity type impurity implantation regions are disposed separated a predetermined width outward from the first first conductivity type impurity implantation regions and first second conductivity type impurity implantation regions. The second first conductivity type and the second second conductivity type impurity implantation regions are alternately disposed, in a direction parallel to the surface of the first conductivity type semiconductor layer, at a pitch narrower than the repeated pitch of the first first conductivity type impurity implantation regions and first second conductivity type impurity implantation regions. Furthermore, in the second step, the plan view shape of a first formation region in which to form the first parallel pn layer is formed into a rectangle having corner portions, each of which is of a stepwise arrangement, by disposing the first first conductivity type impurity implantation regions and first second conductivity type impurity implantation regions in a plan view layout of stripes so that the length in a first direction of the first first and first second conductivity type impurity implantation regions, in which the first first and first second conductivity type impurity implantation regions extend in stripes, is shortened in steps. A second formation region in which to form the second parallel pn layer is disposed so as to be opposed to the first first conductivity type impurity implantation regions or first second conductivity type impurity implantation regions, in a second direction perpendicular to the first direction, in the portion formed in the stepwise arrangement. The width of a first portion, of the first first conductivity type impurity implantation region or first second conductivity type impurity implantation region, which is opposed to the second formation region, is set to be narrower than the width of a second portion other than the first portion. Next, a heat treatment step is carried out. In the heat treatment step, the first first conductivity type impurity implantation regions and the first second conductivity type impurity implantation regions are diffused, thus forming a first parallel pn layer in which the first first conductivity type regions and the first second conductivity type regions are alternately disposed. The second first conductivity type impurity implantation regions and the second second conductivity type impurity implantation regions are diffused, thus forming a second parallel pn layer in which the second first conductivity type regions and the second second conductivity type regions are alternately disposed.

Also, the semiconductor device manufacturing method according to the invention is such that in the aspect of the invention, in the second step, the second first conductivity type impurity implantation region and the second second conductivity type impurity implantation region are disposed in the second formation region so that a region different in conductivity type is opposed to the first portion in the second direction.

Also, the semiconductor device manufacturing method according to the invention is such that in the aspect of the invention, in the second step, a third recess portion wherein the width of a second portion side portion of the first portion is set to be narrower than the width of the other portion of the first portion is formed.

Also, the semiconductor device manufacturing method according to the invention is such that in the aspect of the invention, in the second step, the second first conductivity type impurity implantation region and the second second conductivity type impurity implantation region are disposed so that a region, of the second first conductivity type impurity implantation region and second second conductivity type impurity implantation region, which is of the same conductivity type as that of the first portion, is opposed to the first portion in the first direction. A fourth recess portion wherein the width of a first portion side portion of the region of the same conductivity type is set to be narrower than the width of the other portion of the region of the same conductivity type is formed.

Also, the semiconductor device manufacturing method according to the invention is such that in the aspect of the invention, in the second step, the length in the first direction of the first first conductivity type impurity implantation regions and first second conductivity type impurity implantation regions is shortened in steps each time the first first conductivity type region and the first second conductivity type region are each repeated by two or more pitches, thereby forming the plan view shape of the corner portion of the first formation region into steps.

Also, the semiconductor device manufacturing method according to the invention is such that in the aspect of the invention, in the second step, the second first conductivity type impurity implantation regions and the second second conductivity type impurity implantation regions are disposed in a plan view layout of stripes orientated in the same direction as that of the stripes of the first first conductivity type impurity implantation regions and first second conductivity type impurity implantation regions.

Also, the semiconductor device manufacturing method according to the invention is such that in the aspect of the invention, in the second step, the second first conductivity type impurity implantation regions and the second second conductivity type impurity implantation regions are disposed in a position separated a predetermined width outward from the first first conductivity type impurity implantation regions and first second conductivity type impurity implantation regions. In the heat treatment step, an intermediate region, which has third first conductivity type regions lower in average impurity concentration than the first first conductivity type regions, third second conductivity type regions lower in average impurity concentration than the first second conductivity type regions, fourth first conductivity type regions lower in average impurity concentration than the second first conductivity type regions, and fourth second conductivity type regions lower in average impurity concentration than the second second conductivity type regions, is formed between the first parallel pn layer and the second parallel pn layer by diffusing the first first conductivity type impurity implantation regions, first second conductivity type impurity implantation regions, second first conductivity type impurity implantation regions, and second second conductivity type impurity implantation regions.

Also, the semiconductor device manufacturing method according to the invention is such that in the aspect of the invention, in the second step, the first portion is disposed in a position separated from the second formation region in the second direction. In the heat treatment step, the intermediate region is formed between the first portion and the second formation region.

Also, the semiconductor device manufacturing method according to the invention is such that in the aspect of the invention, the first parallel pn layer and the second parallel pn layer are formed on a low resistance layer lower in resistance than the first conductivity type semiconductor layer. After the heat treatment step, a surface element structure is formed on the opposite side of the first parallel pn layer to the low resistance layer side.

Also, the semiconductor device manufacturing method according to the invention is such that in the aspect of the invention, the first parallel pn layer is formed in an element active portion through which current flows when in on-state, and the second parallel pn layer is formed in an element peripheral portion encompassing the element active portion.

According to the aspects of the invention, it is possible to narrow the pitch of the first first conductivity type regions and first second conductivity type regions for each repeated pitch of the portions formed in the stepwise arrangement (stepped regions) in the corner portion of the first parallel pn layer. Therefore, it is possible to lower the average impurity concentration of the first parallel pn layer for each repeated pitch of the stepped regions, and it is possible, in the portion low in the average impurity concentration, to suppress an adverse effect occurring mutually between the first and second parallel pn layers due to the difference in repeated pitch between the first first conductivity type regions and the first second conductivity type regions. Therefore, it is possible, in the corner portion of the first parallel pn layer, to suppress a partial drop in the breakdown voltage of the boundary region between the element active portion and the breakdown voltage structure portion. Consequently, even though the second parallel pn layer, the repeated pitch of the n-type regions and p-type regions of which is narrower than that of the first parallel pn layer, is disposed in the breakdown voltage structure portion, thus making the breakdown voltage of the breakdown voltage structure portion higher than the breakdown voltage of the element active portion, the drop in breakdown voltage in the boundary region between the element active portion and the breakdown voltage structure portion does not occur in the corner portion of the first parallel pn layer. Also, even though a lower on-resistance is achieved by increasing the average impurity concentration of the first parallel pn layer, it is possible to maintain the difference in breakdown voltage between the element peripheral portion and the element active portion.

According to the semiconductor device and semiconductor device manufacturing method of the invention, the advantageous effect that it is possible to reduce on-resistance and suppress a drop in breakdown voltage is produced.

DETAILED DESCRIPTION OF THE INVENTION

Hereafter, a detailed description will be given, referring to the accompanying drawings, of preferred embodiments of a semiconductor device and semiconductor device manufacturing method according to the invention. In the present specification and the accompanying drawings, n or p in layers and regions prefixed with n or p means respectively that electrons or holes are majority carriers. Also, + and − suffixed to n or p respectively mean a higher impurity concentration and lower impurity concentration than in layers and regions affixed with neither + nor −. In the following description of the embodiments and the accompanying drawings, the same signs are given to like components, thus omitting a redundant description.

Embodiment 1

Figure 1:
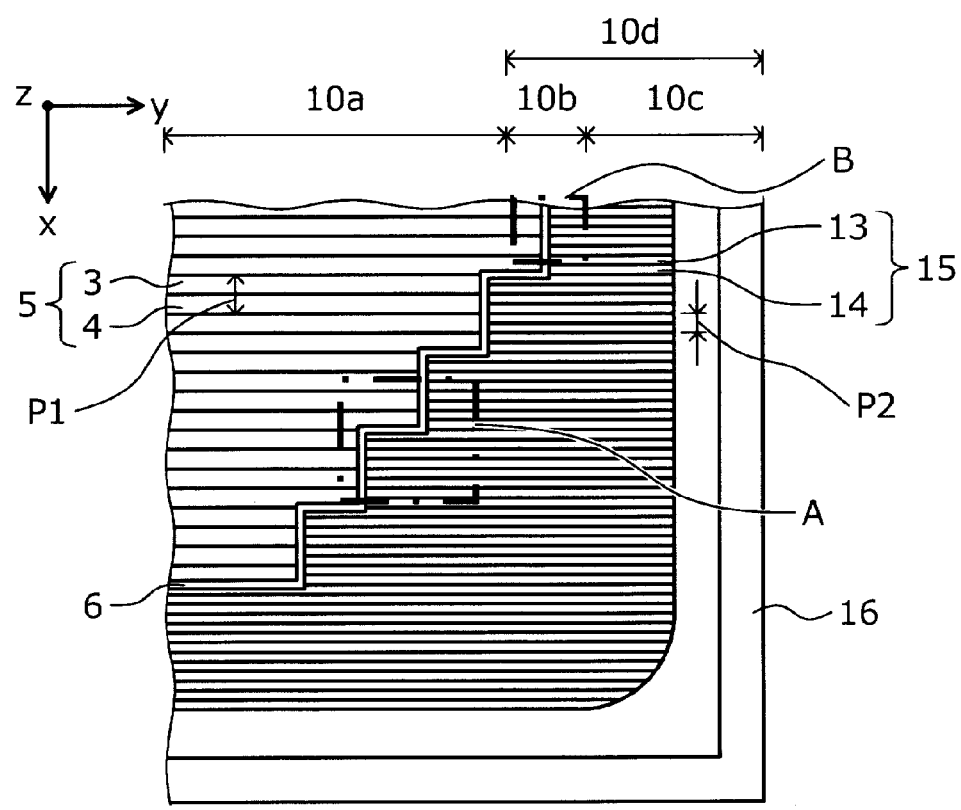
FIG. 1 is a plan view showing a plan view layout of a semiconductor device according to Embodiment 1.
Figure 2:
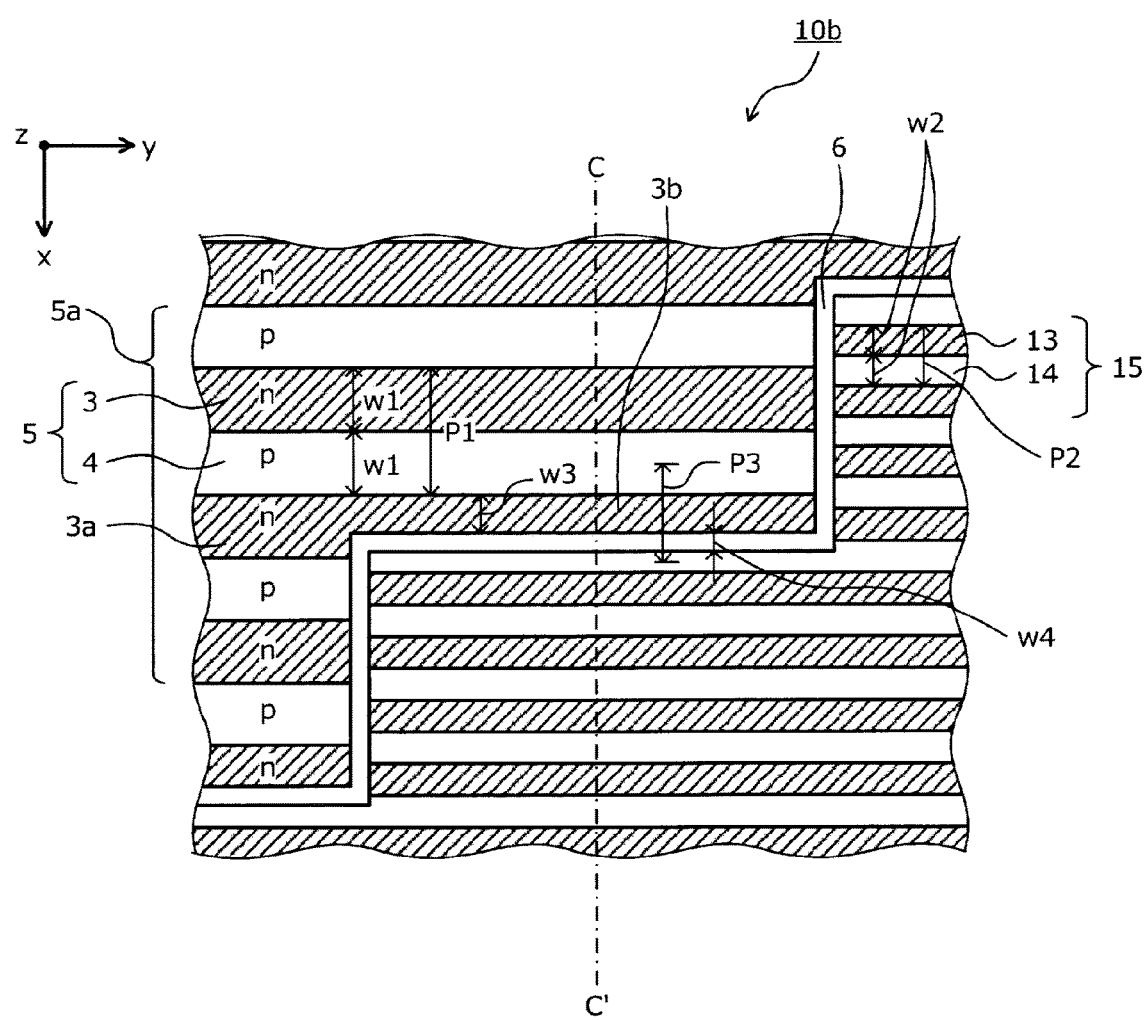
FIG. 2 is a plan view showing in detail the plan view layout in the rectangular frame A of FIG. 1.
Figure 3:
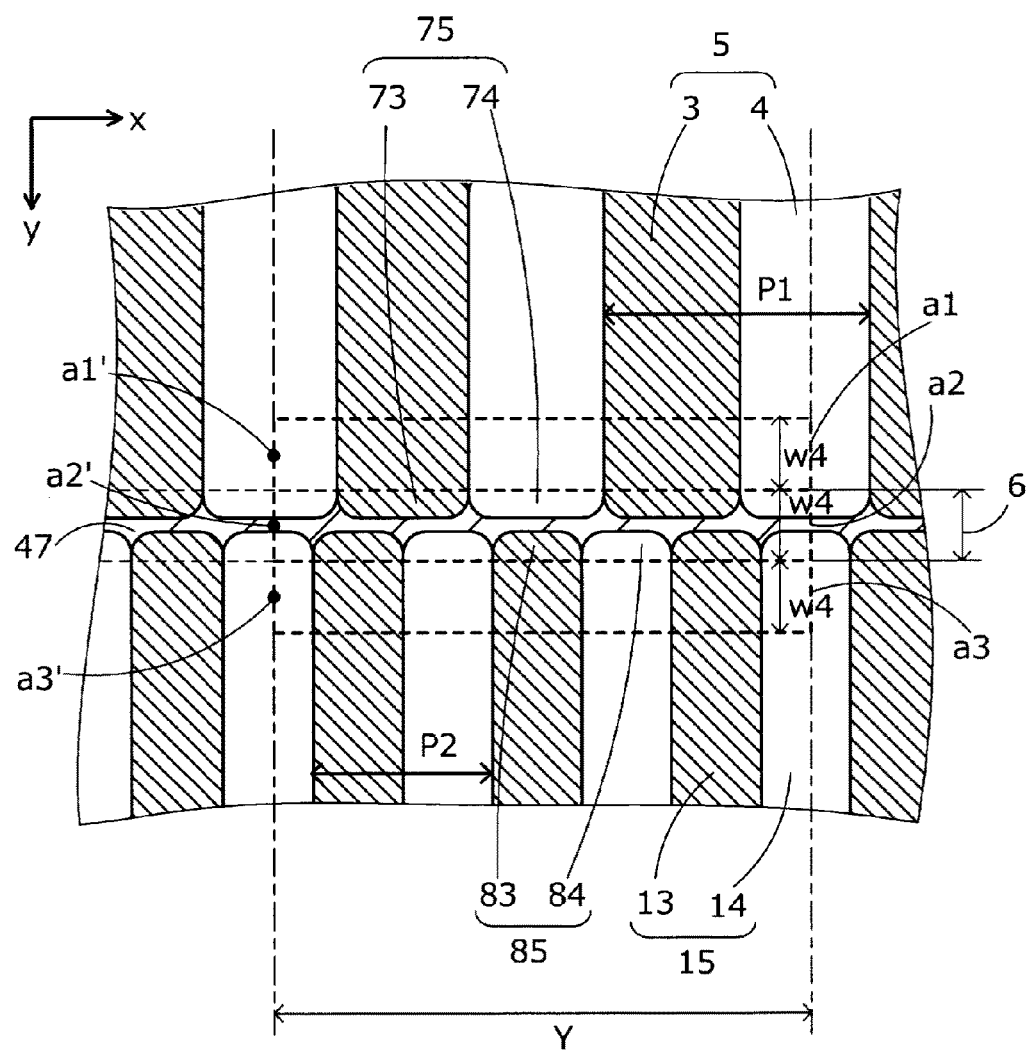
FIG. 3 is a plan view showing in enlarged dimension the plan view layout in the rectangular frame B of FIG. 1.
Figure 4:
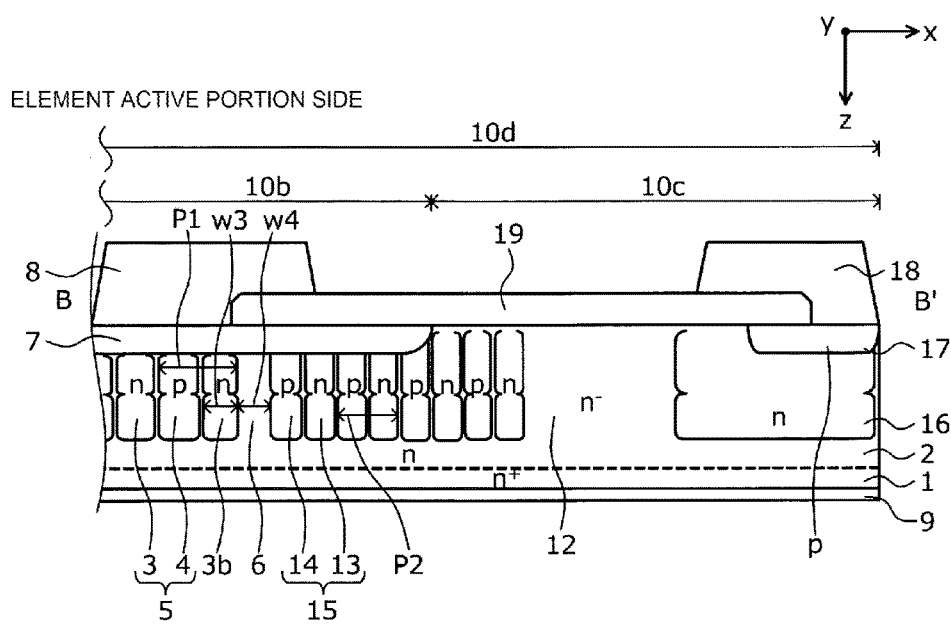
FIG. 4 is a sectional view showing a sectional structure along the section line C-C' of FIG. 2.

A description will be given of a structure of a semiconductor device according to Embodiment 1 with an n-channel type metal oxide semiconductor field effect transistor (MOSFET: insulated gate field effect transistor) having a super junction structure as an example. FIG. 1 is a plan view showing a plan view layout of the semiconductor device according to Embodiment 1. FIG. 2 is a plan view showing in detail the plan view layout in the rectangular frame A of FIG. 1. FIG. 3 is a plan view showing in enlarged dimension the plan view layout in the rectangular frame B of FIG. 1. FIG. 4 is a sectional view showing a sectional structure along the section line C-C' of FIG. 2. FIG. 1 shows a ¼ portion of the semiconductor device according to Embodiment 1. Also, FIG. 1 shows a shape in a plane crossing a first and second parallel pn layers 5 and 15, for example, in a plane at a depth of ½ of the first parallel pn layer 5 of an element active portion 10a.

Also, in FIG. 1, in order to clarify the difference between a repeated pitch P1 of first n-type regions 3 and first p-type regions 4 and a repeated pitch P2 of second n-type regions 13 and second p-type regions 14, the regions are illustrated so as to be smaller in number than in FIG. 4. FIG. 4 shows a sectional structure, passing through an intermediate region 6 between the first and second parallel pn layers 5 and 15, which ranges from the first parallel pn layer 5 of the element active portion 10a to the second parallel pn layer 15 of a breakdown voltage structure portion 10c. The element active portion 10a is a region through which current flows when in on-state. An element peripheral portion 10d, configured of a boundary region 10b and the breakdown voltage structure portion 10c, encompasses the element active portion 10a. The breakdown voltage structure portion 10c is a region which relaxes a chip front surface side electric field and holds a breakdown voltage.

As shown in FIGS. 1 to 4, the semiconductor device according to Embodiment 1 includes the element active portion 10a and the element peripheral portion 10d encompassing the element active portion 10a. The plan view shape of the element active portion 10a forms substantially a rectangle having corner portions (portions which are the vertices of the rectangle) each curved at a predetermined curvature. As an element front surface structure, an unshown MOS gate (an insulated gate formed of a metal oxide semiconductor) structure is provided on the side of a first principal surface (a chip front surface) of the element active portion 10a. An $n^+$-type drain layer 1 is provided on the side of a second principal surface of the element active portion 10a, and an n-type buffer layer 2 is provided in a position deeper from the second principal surface (a chip rear surface) than the $n^+$-type drain layer 1. A drain electrode 9 in contact with the $n^+$-type drain layer 1 is provided on the second principal surface of the element active portion 10a. The n-type buffer layer 2, the $n^+$-type drain layer 1, and the drain electrode 9 are provided all over from the element active portion 10a to the element peripheral portion 10d.

In the element active portion 10a, the first parallel pn layer 5 is provided between the MOS gate structure and the n-type buffer layer 2. The first parallel pn layer 5 is such that the first n-type regions 3 and the first p-type regions 4 are alternately joined in a direction (a horizontal direction) parallel to the first principal surface. The first n-type regions 3 and the first p-type regions 4 are in a plan view layout of stripes. In FIG. 2, the first n-type regions 3 are shown hatched, and the first p-type regions 4 are shown outlined. Hereafter, a horizontal direction in which the stripes of the first parallel pn layer 5 extend is taken as a first direction y, and a horizontal direction (a direction perpendicular to the first direction y) perpendicular to the stripes is taken as a second direction x. The first parallel pn layer 5 is provided all over from the element active portion 10a to the boundary region 10b between the element active portion 10a and the breakdown voltage structure portion 10c, and continues with the second parallel pn layer 15, via the intermediate region 6, in the boundary region 10b.

The first parallel pn layer 5, larger in surface area than the element active portion 10a, has a substantially rectangular plan view shape substantially the same as the element active portion 10a. The length (the length in the first direction y) of the first n-type regions 3 and first p-type regions 4, which is shortened in steps in the corner portion of the first parallel pn layer 5, is set to a length such that the locus, which connects the end portions of the first n-type regions 3 and the end portions of their adjacent first p-type regions 4, forms an approximately substantially circular arc shape. Specifically, the farther outward (the closer toward the breakdown structure portion 10c side) in the second direction x the first n-type regions 3 and the first p-type regions 4 are positioned, the shorter the length of the first n-type regions 3 and first p-type regions 4 becomes each time the first n-type region 3 and the first p-type region 4 are each repeated by predetermined pitches. That is, the corner portion of the first parallel pn layer 5 has a plan view shape wherein a plurality of stepped regions 5a with a predetermined number of consecutive first n-type regions 3 and first p-type regions 4 as one step are disposed in a stepwise arrangement.

Each stepped region 5a continues with the second parallel pn layer 15 via the intermediate region 6. That is, the second parallel pn layer 15 extends, from the breakdown voltage structure portion 10c to the stepped region 5a side, in a stepwise arrangement corresponding to the stepped regions 5a. Therefore, a portion 3b on the side of an end portion in the first direction y (hereafter referred to simply as the "end portion") of a region (in FIG. 2, the first n-type region 3 (hereafter referred to as an outermost region 3a of the stepped region 5a)), of the first n-type regions 3 and first p-type regions 4 configuring the stepped region 5a, which is positioned on the outermost side in the second direction x, is opposed to the second parallel pn layer 15 in the second direction x via the intermediate region 6. Specifically, the end portion side portion 3b of the outermost region 3a of the stepped region 5a is opposed in the second direction x, via the intermediate region 6, to a region (in FIG. 2, the second p-type region 14), of the second n-type regions 13 and second p-type regions 14 of the second parallel pn layer 15, which is different in conductivity type from the outermost region 3a. In FIG. 2, the second n-type regions 13 are shown hatched, and the second p-type regions 14 are shown outlined.

Also, the outermost region 3a of the stepped region 5a forms a plan view shape wherein the outermost region 3a is narrowed to a width (the width in the second direction x) w3 by being uniformly withdrawn inwardly in the second direction x by an outer side portion in the second direction x of the end portion side portion (hereafter referred to as a narrow width portion) 3b. That is, the stepped region 5a is a transition from one pitch to another of the first n-type regions 3 and first p-type regions 4. The width w3 of the narrow width portion 3b of the outermost region 3a of the stepped region 5a is narrower than a width w1 of the first n-type regions 3 of the first parallel pn layer 5 (w3<w1) and wider than a width w2 of the second n-type regions 13 of the second parallel pn layer 15, to be described hereafter (w2<w3). Specifically, the width w3 of the narrow width portion 3b of the outermost region 3a of the stepped region 5a is substantially the average value of the width w1 of the first n-type regions 3 and the width w2 of the second n-type regions 13 (w3=(w1+w2)/2).

A pitch P3 of the first p-type region 4 and second p-type region 14 opposed to each other in the second direction x with the outermost region 3a of the stepped region 5a sandwiched in between is substantially the average value of the repeated pitch P1 of the first n-type regions 3 and first p-type regions 4 and the repeated pitch P2 of the second n-type regions 13 and second p-type regions 14 (P3=(P1+P2)/2). The average impurity concentration of the outermost region 3a of the stepped region 5a is substantially the average value of the average impurity concentration of the first n-type regions 3 and the average impurity concentration of the second n-type regions 13. FIG. 2 shows a condition in which the stepped region 5a is disposed each time the first n-type region 3 and the first p-type region 4 are each repeated by three pitches (a total of six pitches), and each time the second n-type region 13 and the second p-type region 14 are each repeated by four pitches (a total of eight pitches).

The element peripheral portion 10d is configured of the boundary region 10b and breakdown voltage structure portion 10c. The element peripheral portion 10d is, for example, a region outside of the outer side end portion of a gate electrode of MOS gate structure disposed on the outermost side, or when an n$^+$-type source region is disposed outside of the gate electrode, is a region outside of the outer side end portion of the n$^+$-type source region. The breakdown voltage structure portion 10c encompasses the element active portion 10a with the boundary region 10b sandwiched in between. The breakdown voltage structure portion 10c is, for example, a region outside of the outer side end portion of a p-type base region 7 disposed on the outermost side.

In the breakdown voltage structure portion 10c, the second parallel pn layer 15 is provided on the n-type buffer layer 2. The second parallel pn layer 15 is such that the second n-type regions 13 and the second p-type regions 14 are alternately joined in the horizontal direction. The second n-type regions 13 and the second p-type regions 14 are in a plan view layout of stripes. The direction of the stripes of the second parallel pn layer 15 is the same as the direction of the stripes of the first parallel pn layer 5. The repeated pitch P2 of the second n-type regions 13 and second p-type regions 14 is narrower than the repeated pitch P1 of the first n-type regions 3 and first p-type regions 4.

The average impurity concentration of the second n-type regions 13 and the average impurity concentration of the second p-type regions 14 are lower respectively than the average impurity concentration of the first n-type regions 3 and the average impurity concentration of the first p-type regions 4. As the average impurity concentration becomes lower, and a depletion layer becomes easier to extend in the second parallel pn layer 15 in the direction of the outer periphery, by narrowing the repeated pitch P2 of the second n-type regions 13 and second p-type regions 14, a rise in initial breakdown voltage is facilitated. The second p-type regions 14 act in the same way as a guard ring until depleted. As the electric field of the second n-type regions 13 is thereby relaxed, a rise in the breakdown voltage of the breakdown voltage structure portion 10c is facilitated.

The second parallel pn layer 15 is provided all over from the breakdown voltage structure portion 10c to the boundary region 10b so as to encompass the first parallel pn layer 5 with the intermediate region 6 sandwiched in between. Also, the second parallel pn layer 15 continues with the first parallel pn layer 5 via the intermediate region 6, as heretofore described. The intermediate region 6 is a region forming a substantially parallel pn layer wherein respective impurity implantation regions which form the first and second parallel pn layers 5 and 15, which are formed separately from one another by first and second ion implantations, to be described hereafter, are diffused into a region (a third region to be described hereafter) into which the impurities between the impurity implantation regions are not ion implanted. The intermediate region 6, configured of n-type regions lower in average impurity concentration than the first n-type regions 3 and p-type regions lower in average impurity concentration than the first p-type regions 4, is a region which is easier to deplete than the first parallel pn layer 5 when in off-state.

Specifically, a third parallel pn layer 75 having third n-type regions 73 and third p-type regions 74, which are alternately disposed at a repeated pitch substantially equal to the repeated pitch P1 of the first n-type regions 3 and first p-type regions 4 and decrease in impurity concentration toward the outer side, is disposed in the inner side (element active portion 10a side) portion of the intermediate region 6. A fourth parallel pn layer 85 having fourth n-type regions 83 and fourth p-type regions 84, which are alternately disposed at a repeated pitch substantially equal to the repeated pitch P2 of the second n-type regions 13 and second p-type regions 14 and decrease in impurity concentration toward the inner side, is disposed in the outer side portion of the intermediate region 6. The third n-type regions 73 lower in average impurity concentration than the first n-type regions 3, the third p-type regions 74 lower in average impurity concentration than the first p-type regions 4, the fourth n-type regions 83 lower in average impurity concentration than the second n-type regions 13, and the fourth p-type regions 84 lower in average impurity concentration than the second p-type regions 14 are disposed in the intermediate region 6.

Also, the p-type and n-type impurity doses of a region a1 of the first parallel pn layer 5 and a region a3 of the second parallel pn layer 15, which have a width w4 the same as an intermediate region a2 of a section Y sandwiched between the positions in each of which the center of the first p-type region 4 is opposed to the center of the second p-type region 14, satisfy $Ca2<(Ca1+Ca3)/2$ with respect to the intermediate region a2 of the section Y. Ca1 to Ca3 are the impurity doses of the regions a1 to a3 respectively. The center of the first p-type region 4 being opposed to the center of the second p-type region 14 is that the center in the second direction x of the first p-type region 4 and the center in the second direction x of the second p-type region 14 are positioned on the same straight line in the first direction y. Therefore, the intermediate region 6 is a region which is more likely to be depleted than the first parallel pn layer 5 when in off-state. Furthermore, in the positions in each of which the center of the first p-type region 4 is opposed to the center of the second p-type region 14, the impurity concentration at a midpoint a2' of the intermediate region a2 of the section Y is lower than the impurity concentration at a midpoint a1' of the region a1 of the first parallel pn layer 5 and the impurity concentration at a midpoint a3' of the region a3 of the second parallel pn layer 15.

The third parallel pn layer 75 and fourth parallel pn layer 85 disposed in the intermediate region 6 are opposed to each other. A transition region 47, into which are diffused the impurities of the respective impurity implantation regions of the first and second parallel pn layers 5 and 15 having different repeated pitches, exists between the third parallel pn layer 75 and the fourth parallel pn layer 85. The third parallel pn layer 75 and the fourth parallel pn layer 85 may be in contact with each other so as to be superimposed one on the other by diffusing the impurities between the respective impurity implantation regions forming the first and second parallel pn layers 5 and 15.

A portion of the second parallel pn layer 15 disposed in the breakdown voltage structure portion 10c may be provided in a thickness such as not to reach the first principal surface from the n-type buffer layer 2. That is, the impurities, which are ion implanted into an epitaxial substrate by the first and second ion implantations, to be described hereafter, for forming the second parallel pn layer 15, do not have to be diffused to the first principal surface by the subsequent heat treatment. In this case, one portion of an uppermost n⁻-type semiconductor layer epitaxially grown when forming the second parallel pn layer 15 remains between the second parallel pn layer 15 and the first principal surface, as an n⁻-type region, in the breakdown voltage structure portion 10c.

An n⁻-type region 12 is provided on the n-type buffer layer 2 outside of the second parallel pn layer 15. The n⁻-type region 12 is provided in a thickness such as to reach the first principal surface from the n-type buffer layer 2. The n⁻-type region 12, encompassing the second parallel pn layer 15, has the function of suppressing the extension of a depletion layer which spreads outwardly of the second parallel pn layer 15 when in off-state. The average impurity concentration of the n⁻-type region 12 is lower than the average impurity concentration of the second n-type regions 13. An n-channel stopper region 16 is provided on the n-type buffer layer 2 in the terminal region of the breakdown voltage structure portion 10c.

The n-channel stopper region 16 is provided in a thickness such as to reach the first principal surface from the n-type buffer layer 2. A p-channel stopper region may be provided in place of the n-channel stopper region 16. A p-type outermost peripheral region 17 is provided on the first principal surface side of the n-channel stopper region 16. A channel stopper electrode 18 is connected to the p-type outermost peripheral region 17 and is electrically insulated from a source electrode 8 of MOS gate structure by an interlayer insulating film 19 covering the first principal surface in the element peripheral portion 10d.

Although not particularly limited thereto, for example, when the semiconductor device of Embodiment 1 is a horizontal type MOSFET and is of a breakdown voltage class of 600V, the dimensions and impurity concentrations of the individual portions take the following values. The thickness of a drift region (the thickness of the first parallel pn layer 5) is 35 μm, and the width w1 of the first n-type regions 3 and first p-type regions 4 is 6.0 μm (the repeated pitch P1 is 12.0 μm). The peak impurity concentration in the width direction of the first n-type regions 3 and first p-type regions 4 disposed on an n⁻-type semiconductor layer 21c surface equivalent to a depth of ½ of the drift region (an epitaxial layer 24 to be described hereafter (refer to FIG. 9)) is $4.0 \times 10^{15}/cm^3$. The width w2 of the second n-type regions 13 and second p-type regions 14 is 4.0 μm (the repeated pitch P2 is 8.0 μm). The peak impurity concentration in the width direction of the second n-type regions 13 and second p-type regions 14 disposed on the n⁻-type semiconductor layer 21c surface equivalent to a depth of ½ of the drift region (the epitaxial layer 24 to be described hereafter) is $2.0 \times 10^{15}/cm^3$. The width w3 of the narrow width portion 3b of the outermost region 3a of the stepped region 5a is 4 μm. The pitch P3 of the first p-type region 4 and second p-type region 14 opposed to each other in the second direction x with the outermost region 3a of the stepped region 5a sandwiched in between is 10.0 μm. The stepped region 5a is disposed each time the first n-type region 3 and the first p-type region 4 are each repeated by three pitches (a total of six pitches). The width (the width in the first direction y of the intermediate region 6) w4 in the first direction y between the first and second parallel pn layers 5 and 15 is 2 μm. It is preferable that the peak impurity concentration in the width direction of the n⁻-type region disposed on the n⁻-type semiconductor layer 21c surface equivalent to a depth of ½ of the drift region (the epitaxial layer 24 to be described hereafter) is $1.0 \times 10^{15}/cm^3$ or less.

In Embodiment 1, a configuration wherein the first parallel pn layer 5 is provided between the MOS gate structure and the n-type buffer layer 2 in the element active portion 10a, and the second parallel pn layer 15 is provided on the n-type buffer layer 2 in the breakdown voltage structure portion 10c, is shown, but a configuration may be such that the first parallel pn layer 5 is provided between the MOS gate structure and the n⁺-type drain layer 1, and that the second parallel pn layer 15 is provided on the n⁺-type drain layer 1.

Next, a description will be given of a method of manufacturing the semiconductor device according to Embodiment 1. FIGS. 5 to 10 are sectional views showing conditions of the semiconductor device according to Embodiment 1 in the process of being manufactured. FIGS. 11A and 11B are illustrations showing conditions of the semiconductor device according to Embodiment 1 in the process of being manufactured. FIGS. 11A and 11B show conditions of a corner portion of the first parallel pn layer 5 in the process of being formed. FIG. 11A shows a plan view layout of an impurity implantation region after the first and second ion implantations for forming the first parallel pn layer 5 and before heat treatment, and FIG. 11B shows a condition after the heat treatment. FIGS. 5 to 10 illustrate sectional conditions of the first parallel pn layer 5 of the element active portion 10a in the process of being manufactured, wherein a condition of the second parallel pn layer 15 of the breakdown voltage structure portion 10c in the process of being manufactured is omitted from the illustration, but the second parallel pn layer 15 is formed at the same time as the first parallel pn layer 5 by the same method as the first parallel pn layer 5. That is, in FIGS. 5 to 10, a condition in which the repeated pitch P2 is narrowed is a sectional condition of the second parallel pn layer 15 in the process of being manufactured.

Figure 5:
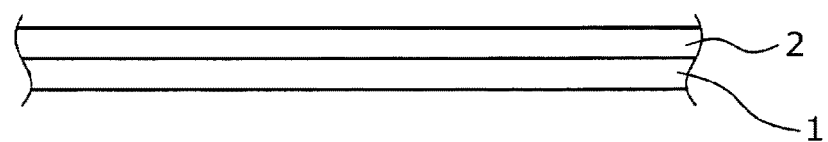
FIG. 5 is a sectional view showing a condition of the semiconductor device according to Embodiment 1 in the process of being manufactured.
Figure 6:
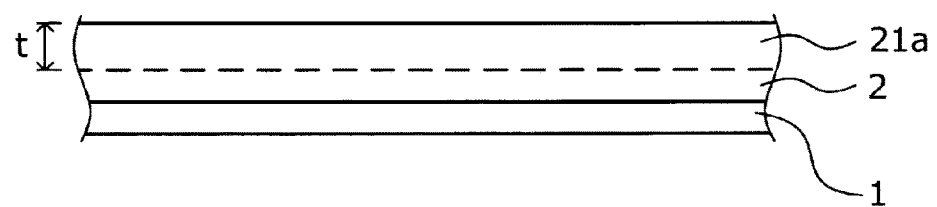
FIG. 6 is a sectional view showing a condition of the semiconductor device according to Embodiment 1 in the process of being manufactured.
Figure 7:
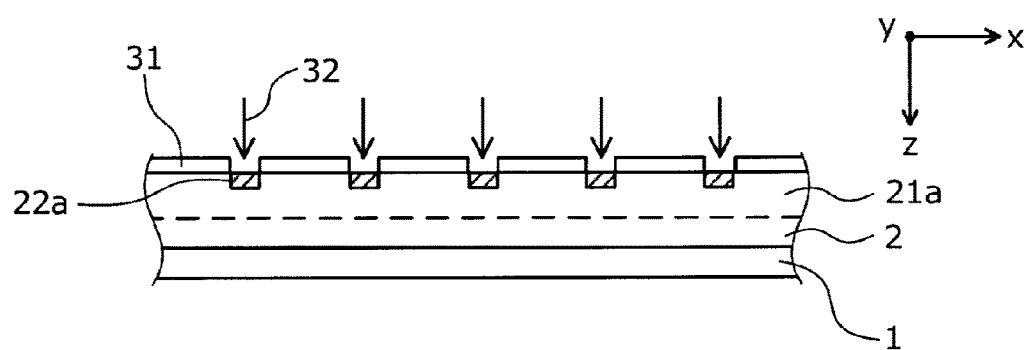
FIG. 7 is a sectional view showing a condition of the semiconductor device according to Embodiment 1 in the process of being manufactured.

Firstly, as shown in FIG. 5, the n-type buffer layer 2 is formed, by epitaxial growth, on the front surface of an n⁺-type starting substrate forming the n⁺-type drain layer 1. Next, as shown in FIG. 6, a first n⁻-type semiconductor layer 21a is deposited (formed) to a predetermined thickness, by epitaxial growth, on the n-type buffer layer 2. Next, as shown in FIG. 7, a resist mask 31, portions of which corresponding to regions in which to form the first p-type regions 4 of the first parallel pn layer 5 and the second p-type regions 14 of the second parallel pn layer 15 are opened, is formed on the n⁻-type semiconductor layer 21a. The width of the opening portions of the resist mask 31 is narrower than the width w1 of the first p-type regions 4 in the element active portion 10a, and is narrower than the width w2 of the second p-type regions 14 in the breakdown voltage structure portion 10c. Also, the width of the opening portions of the resist mask 31 is narrower in the breakdown voltage structure portion 10c than in the element active portion 10a. Next, a first ion implantation 32 of p-type impurities is performed with the resist mask 31 as a mask. By performing the first ion implantation 32, p-type impurity implantation regions 22a are selectively formed in a surface layer of the n⁻-type semiconductor layer 21a, at the predetermined repeated pitch P1, in the element active portion 10a, and p-type impurity implantation regions 42a are selectively formed in the surface layer of the n⁻-type semiconductor layer 21a, at the predetermined repeated pitch P2, in the breakdown voltage structure portion 10c (refer to FIG. 11A). The depth of the p-type impurity implantation regions 22a and 42a is shallower than, for example, a thickness t of the n⁻-type semiconductor layer 21a.

Figure 8:
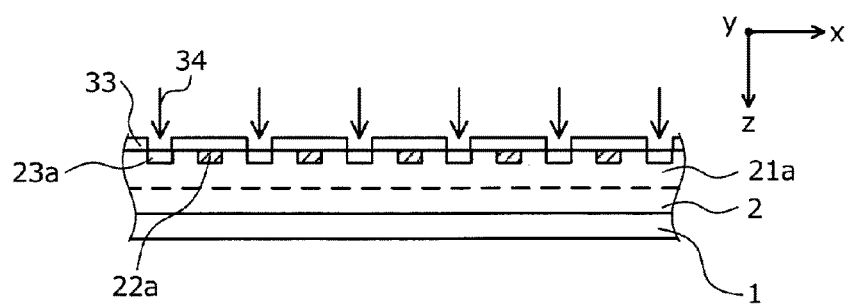
FIG. 8 is a sectional view showing a condition of the semiconductor device according to Embodiment 1 in the process of being manufactured.

Next, as shown in FIG. 8, after removing the resist mask 31, a resist mask 33, portions of which corresponding to regions in which to form the first n-type regions 3 of the first parallel pn layer 5 and the second n-type regions 13 of the second parallel pn layer 15 are opened, is formed on the n⁻-type semiconductor layer 21a. The width of the opening portions of the resist mask 33 is narrower than the width w1 of the first n-type regions 3 in the element active portion 10a, and is narrower than the width w2 of the second n-type regions 13 in the breakdown voltage structure portion 10c. Also, the width of the opening portions of the resist mask 33 is narrower in the breakdown voltage structure portion 10c than in the element active portion 10a. Next, a second ion implantation 34 of n-type impurities is performed with the resist mask 33 as a mask. By performing the second ion implantation 34, n-type impurity implantation regions 23a are selectively formed in the surface layer of the n⁻-type semiconductor layer 21a, at the predetermined repeated pitch P1, in the element active portion 10a, and n-type impurity implantation regions 43a are selectively formed in the surface layer of the n⁻-type semiconductor layer 21a, at the predetermined repeated pitch P2, in the breakdown voltage structure portion 10c (refer to FIG. 11A). The depth of the n-type impurity implantation regions 23a and 43a is shallower than, for example, the thickness t of the n⁻-type semiconductor layer 21a. The step of forming the n-type impurity implantation regions 23a and 43a may be interchanged with the step of forming the p-type impurity implantation regions 22a and 42a.

In the first and second ion implantations 32 and 34 described above, the impurity implantation regions 22a, 23a, 42a and 43a and stepped regions 25a are disposed in the following way. As shown in FIG. 11A, the n-type impurity implantation regions 23a and the p-type impurity implantation regions 22a are disposed separated a predetermined distance d1 in the element active portion 10a. The n-type impurity implantation regions 43a and the p-type impurity implantation regions 42a are disposed separated a predetermined distance d2 in the breakdown voltage structure portion 10c. That is, a width w1 of the n-type impurity implantation regions 23a and p-type impurity implantation regions 22a is set to be narrower than the width w1 of the first n-type regions 3 and first p-type regions 4 of the first parallel pn layer 5. A width w12 of the n-type impurity implantation regions 43a and p-type impurity implantation regions 42a is set to be narrower than the width w2 of the second n-type regions 13 and second p-type regions 14 of the second parallel pn layer 15. The impurity implantation regions 22a, 23a, 42a, and 43a are disposed so as to extend to the boundary region 10b between the element active portion 10a and the breakdown voltage structure portion 10c. Specifically, in the first direction y, the n-type impurity implantation regions 23a and p-type impurity implantation regions 22a of the element active portion 10a are disposed so as to extend in a first region 10e on the inner side of the boundary region 10b (the element active portion 10a side). The n-type impurity implantation regions 43a and p-type impurity implantation regions 42a of the breakdown voltage structure portion 10c are disposed so as to extend in a second region 10f on the outer side of the boundary region 10b (the breakdown voltage structure portion 10c side).

Also, the impurity implantation regions 22a and 23a of the element active portion 10a and the impurity implantation regions 42a and 43a of the breakdown voltage structure portion 10c may be disposed separated in the first direction y by covering the vicinity of the boundary between the first region 10e and the second region 10f with the resist masks 31 and 33 and thus forming a third region 10g into which to ion implant no impurity. The third region 10g is a portion which forms the intermediate region 6 between the first and second parallel pn layers 5 and 15 by heat treatment, to be described hereafter, and is formed to a width w4 substantially the same as that of the intermediate region 6. Furthermore, in the vicinity of the corner portion of the region in which to form the first parallel pn layer 5, each stepped region 25a is formed by shortening the length of the n-type impurity implantation regions 23a and p-type impurity implantation regions 22a of the element active portion 10a each time the n-type impurity implantation region 23a and the p-type impurity implantation region 22a are each repeated by predetermined pitches. The n-type impurity implantation regions 43a and p-type impurity implantation regions 42a of the breakdown voltage structure portion 10c are extended on the element active portion 10a side in a stepwise arrangement corresponding to the stepped regions 25a. Each stepped region 25a is brought into a condition in which the stepped region 25a is opposed to the end portions of the n-type impurity implantation regions 43a and p-type impurity implantation regions 42a with the third region 10g sandwiched in between in the first direction y.

Also, each stepped region is brought into a condition in which an end portion side portion 26b of a region (in FIG. 11A, the n-type impurity implantation region 23a (hereafter referred to as an outermost impurity implantation region 26a)), of the n-type impurity implantation regions 23a and p-type impurity implantation regions 22a included in the stepped region 25a, which is positioned on the outermost side in the second direction x, is opposed in the second direction x to a region (in FIG. 11A, the p-type impurity implantation region 42a) different in conductivity type from the outermost impurity implantation region 26a. Also, the outermost impurity implantation region 26a of the stepped region 25a is formed into a plan view shape wherein the outermost impurity implantation region 26a is narrowed to a width w13 by being uniformly withdrawn inwardly in the second direction x by an outer side portion in the second direction x of the end portion side portion (narrow width portion) 26b. The width w13 of the narrow width portion 26b of the outermost impurity implantation region 26a of the stepped region 25a is set to be narrower than the width w11 of the n-type impurity implantation regions 23a (w13<w11), and set to be wider than the width w12 of the n-type impurity implantation regions 43a (w12<w13). Specifically, the width w13 of the narrow width portion 26b of the outermost impurity implantation region 26a of the stepped region 25a is set to substantially the average value of the width w11 of the n-type impurity implantation regions 23a and the width w12 of the p-type impurity implantation regions 42a (w13= (w11+w12)/2).

Although not particularly limited thereto, for example, when the semiconductor device of Embodiment 1 is a vertical type MOSFET and is of a breakdown voltage class of 600V, the dimensions of the individual n-type impurity regions take the following values. The width w11 of the n-type impurity implantation regions 23a and p-type impurity implantation regions 22a of the element active portion 10a is 3.0 µm (the repeated pitch P1 is 12.0 µm), and the impurity dose of the n-type impurity implantation regions 23a and p-type impurity implantation regions 22a is on the order of $0.2\times10^{13}/cm^2$ or more and $2.0\times10^{13}/cm^2$ or less. The width w12 of the n-type impurity implantation regions 43a and p-type impurity implantation regions 42a of the breakdown voltage structure portion 10c is 1.0 µm (the repeated pitch P2 is 8.0 µm), and the dose of the n-type impurity implantation regions 43a and p-type impurity implantation regions 42a is on the order of $0.2\times10^{13}/cm^2$ or more and $2.0\times10^{13}/cm^2$ or less. The width w13 of the narrow width portion 26b of the outermost impurity implantation region 26a is 2.0 µm (=(3.0 µm+1.0 µm)/2). The pitch P3 of the p-type impurity implantation region 22a and p-type impurity implantation region 42a which are opposed to each other in the second direction x with the outermost impurity implantation region 26a of the stepped region 25a sandwiched in between is 10.0 µm. The stepped region 25 wherein the n-type impurity implantation region 43a and the p-type impurity implantation region 42a are each repeated by four pitches (a total of eight pitches) each time the n-type impurity implantation region 23a and the p-type impurity implantation region 22a are each repeated by three pitches (a total of six pitches), is disposed in the vicinity of the corner portion of the region in which to form the first parallel pn layer 5.

Figure 9:
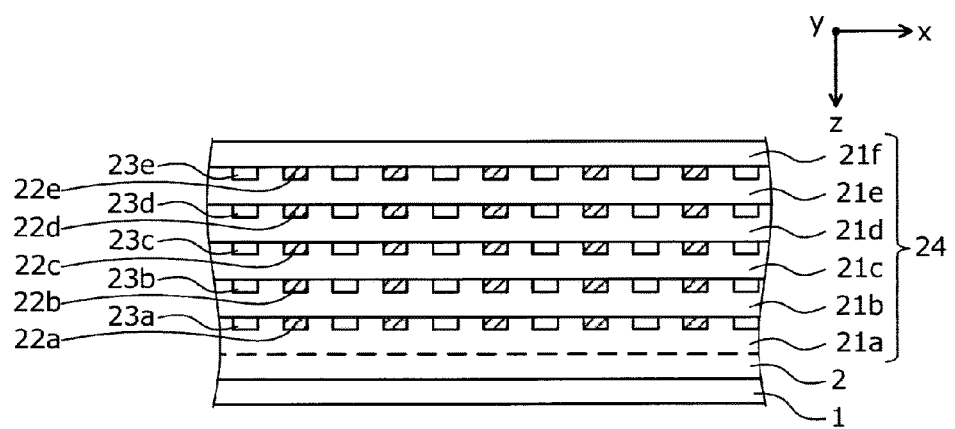
FIG. 9 is a sectional view showing a condition of the semiconductor device according to Embodiment 1 in the process of being manufactured.

Next, as shown in FIG. 9, after removing the resist mask 33, a plurality of n⁻-type semiconductor layers 21b to 21f are further deposited by epitaxial growth on the n⁻-type semiconductor layer 21a, thus forming the epitaxial layer 24 of a predetermined thickness which is formed of the plurality (for example, six) of n⁻-type semiconductor layers 21a to 21f. At this time, each time the n⁻-type semiconductor layer 21b to 21e is deposited, the first and second ion implantations 32 and 34 are carried out in the same way as in the first n⁻-type semiconductor layer 21a, thus forming the p-type impurity plantation regions and n-type impurity implantation regions in each of the element active portion 10a and breakdown voltage structure portion 10c. The plan view layout of the p-type impurity implantation regions and n-type impurity implantation regions formed in each of the element active portion 10a and breakdown voltage structure portion 10c is the same as the plan view layout of the p-type impurity implantation regions and n-type impurity implantation regions formed in the first n⁻-type semiconductor layer 21a. FIG. 9 shows a condition in which p-type impurity implantation regions 22b to 22e and n-type impurity implantation regions 23b to 23e are formed in the n⁻-type semiconductor layers 21b to 21e, respectively, in the element active portion 10a. The first and second ion implantations 32 and 34 do not have to be carried out on the uppermost n⁻-type semiconductor layer 21f, of the n⁻-type semiconductor layers 21a to 21f forming the epitaxial layer 24. The epitaxial substrate wherein the n-type buffer layer 2 and the epitaxial layer 24 are stacked in order on the front surface of the n⁺-type starting substrate forming the n⁺-type drain layer 1, is formed by the steps so far.

Figure 10:
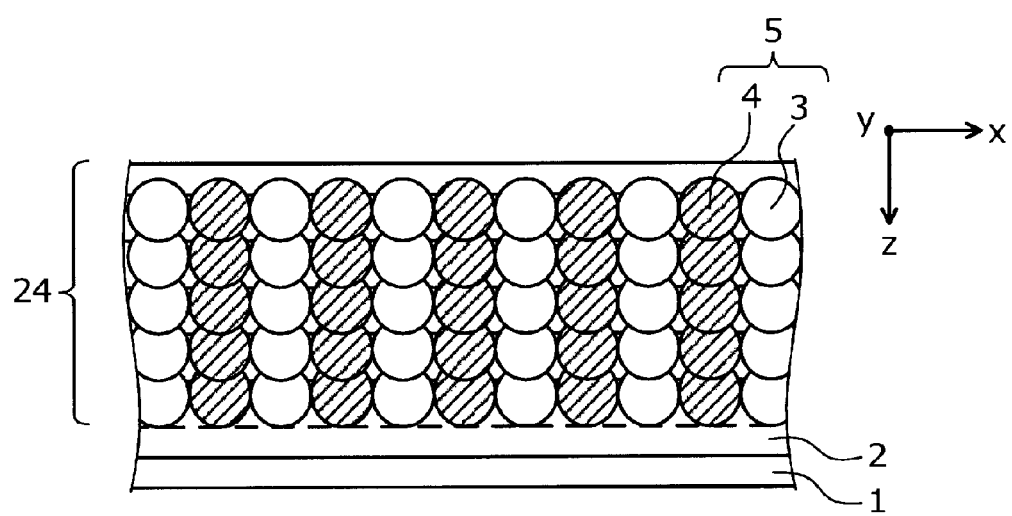
FIG. 10 is a sectional view showing a condition of the semiconductor device according to Embodiment 1 in the process of being manufactured.
Figure 11A:
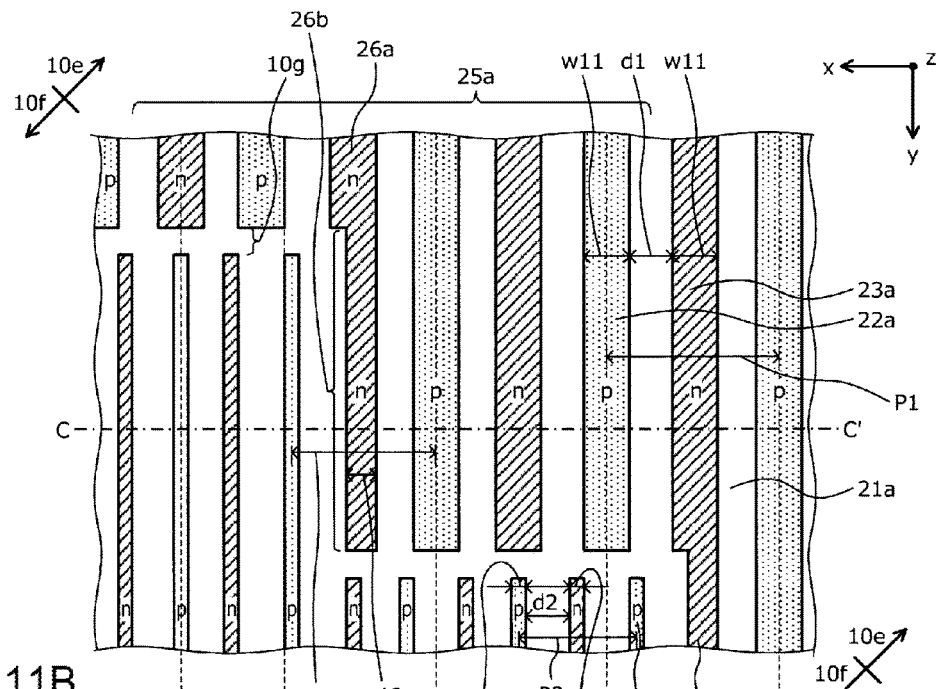
FIGS. 11A and 11B are illustrations showing a condition of the semiconductor device according to Embodiment 1 in the process of being manufactured.
Figure 11B:
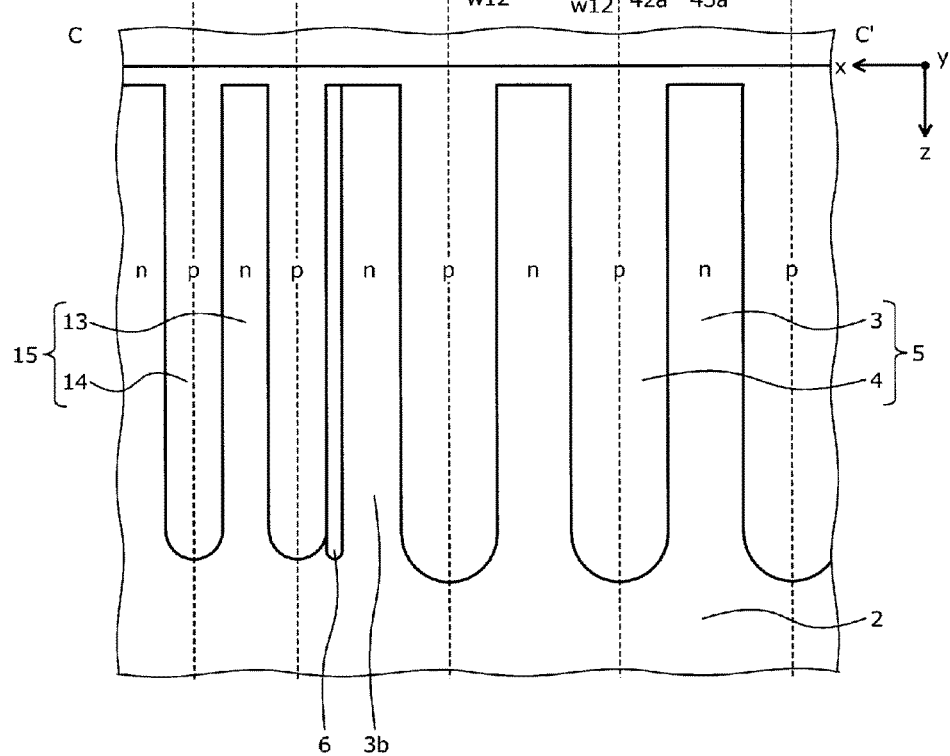

Next, as shown in FIGS. 10 and 11B, the respective n-type impurity implantation regions and p-type impurity implantation regions in the n⁻-type semiconductor layers 21a to 21e are diffused by heat treatment. FIG. 11B shows a sectional structure when the n⁻-type semiconductor layers 21a to 21f after the heat treatment are sectioned along the section line C-C' of FIG. 11A. The n-type impurity implantation regions and the p-type impurity implantation regions, as they are formed in a linear shape extending in the first direction y, each expand in a substantially cylindrical shape with an ion implantation place, which extends in a linear shape in the first direction y, as a central axis. By so doing, in the element active portion 10a, the first n-type region 3 is formed by the n-type impurity implantation regions 23a to 23e opposed to each other in a depth direction z being connected so as to be superimposed one on another, and the first p-type region 4 is formed by the p-type impurity implantation regions 22a to 22e opposed to each other in the depth direction z being connected so as to be superimposed one on another. Also, the first parallel pn layer 5 is formed by the first n-type regions 3 and first p-type regions 4 opposed to each other in the second direction x being connected so as to be superimposed one on another. In the breakdown voltage structure portion 10c too, in the same way, the second n-type region 13 is formed by the n-type impurity implantation regions (not shown) opposed to each other in the depth direction z being connected so as to be superimposed one on another, and the second p-type region 14 is formed by the p-type impurity implantation regions (not shown) opposed to each other in the depth direction z being connected so as to be superimposed one on another. Also, the second parallel pn layer 15 is formed by the second n-type regions 13 and second p-type regions 14 opposed to each other in the second direction x being connected so as to be superimposed one on another. At this time, n-type impurities and p-type impurities are diffused into the third region 10g of the boundary region 10b, respectively, from the n-type impurity implantation regions and p-type impurity implantation regions of the element active portion 10a and breakdown voltage structure portion 10c, thus forming the intermediate region 6.

The n-channel stopper region 16 may be formed, for example, by the first ion implantation 32 at the same time as the formation of the first and second p-type regions 4 and 14, or by selectively ion implanting p-type impurities at a timing different from that of the first ion implantation 32. The n⁻-type region 12 may be formed by covering the region in which to form the n⁻-type region 12 with the resist masks 31 and 33 when performing the first and second ion implantations 32 and 33, or furthermore, may be formed by adding the step of selectively ion implanting n-type impurities. Next, remaining steps such as the steps of forming the MOS gate structure, p-type outermost peripheral region 17, interlayer insulating film 19, source electrode 8, channel stopper electrode 18, and drain electrode 9 are carried out in order by a common method. Subsequently, the epitaxial substrate is diced (cut) into chips, thereby completing the super junction semiconductor device shown in FIGS. 1 to 4.

Figure 12:
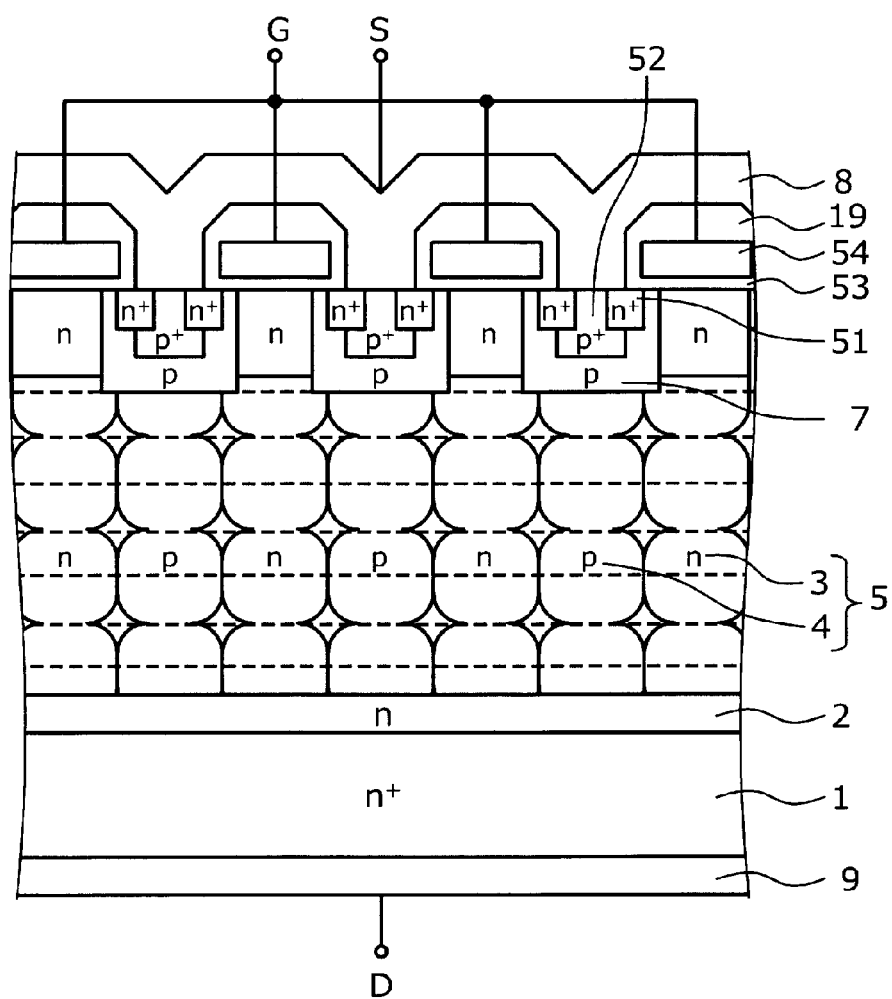
FIG. 12 is a sectional view showing an example of an element active portion of the semiconductor device according to Embodiment 1.
Figure 13:
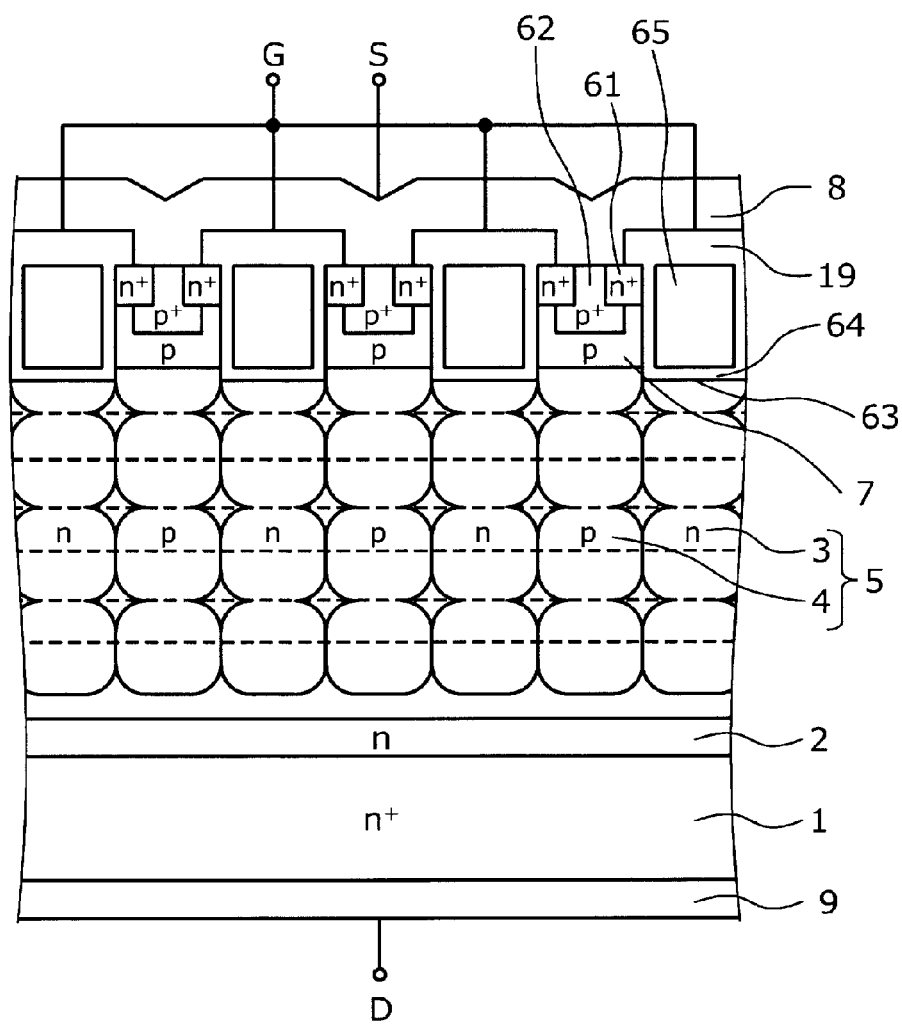
FIG. 13 is a sectional view showing another example of the element active portion of the semiconductor device according to Embodiment 1.

Next, a description will be given of an example of the element active portion 10a of the semiconductor device according to Embodiment 1. FIG. 12 is a sectional view showing an example of the element active portion of the semiconductor device according to Embodiment 1. FIG. 13 is a sectional view showing another example of the element active portion of the semiconductor device according to Embodiment 1. As shown in FIG. 12, a MOS gate structure of a common planar gate structure, which is formed of the p-type base regions 7, n⁺-type source regions 51, p⁺-type contact regions 52, gate insulating films 53, and gate electrodes 54, is provided on the first principal surface side in the element active portion 10a. Also, as shown in FIG. 13, a MOS gate structure of a common planar gate structure, which is formed of the p-type base regions 7, n⁺-type source regions 61, p⁺-type contact regions 62, trenches 63, gate insulating films 64, and gate electrodes 65, may be provided on the first principal surface side in the element active portion 10a. Each of the MOS gate structures only has to be such that the p-type base regions 7 are disposed so as to be in contact in the depth direction with the first p-type regions 4 of the first parallel pn layer 5. Each dashed line in the first parallel pn layer 5 is the boundary between adjacent ones of the plurality of n⁻-type semiconductor layers stacked by epitaxial growth when forming the first parallel pn layer 5.

As heretofore described, according to Embodiment 1, it is possible, in the corner portion of the first parallel pn layer, to narrow the pitch of the first n-type regions and first p-type regions for each repeated pitch of the stepped regions by shortening the length of the first n-type regions and first p-type regions in steps and thus forming the plurality of stepped regions in a stepwise arrangement, and by partially narrowing the width of the outermost region of each stepped region. Therefore, it is possible to lower the impurity concentration of the first parallel pn layer for each repeated pitch of the stepped regions, and it is possible, in a portion lower in impurity concentration, to suppress an adverse effect occurring mutually between the first and second parallel pn layers due to the difference in repeated pitch between the n-type regions and the p-type regions. Therefore, it is possible, in the corner portion of the first parallel pn layer, to suppress a partial drop in the breakdown voltage of the boundary region between the element active portion and the breakdown voltage structure portion. Consequently, even though the second parallel pn layer lower in the repeated pitch of the n-type regions and p-type regions than the first parallel pn layer is disposed in the breakdown voltage structure portion, thus setting the breakdown voltage of the breakdown voltage structure portion to be higher than the breakdown voltage of the element active portion, the drop in breakdown voltage in the boundary region between the element active portion and the breakdown voltage structure portion does not occur in the corner portion of the first parallel pn layer. Therefore, it is possible to achieve a rise in the breakdown voltage of the whole element by setting the breakdown voltage of the element peripheral portion (the breakdown voltage structure portion and the boundary region) to be higher than the breakdown voltage of the element active portion. Also, even though the impurity concentration of the first parallel pn layer is set to be higher, thus achieving lower on-resistance, it is possible to maintain the difference in breakdown voltage between the element peripheral portion and the element active portion. Consequently, it is possible to reduce on-resistance and suppress a drop in breakdown voltage.

Also, according to Embodiment 1, the third region into which to ion implant no impurity is formed between the impurity implantation regions forming the first parallel pn layer and the impurity implantation regions forming the second parallel pn layer, and by thermally diffusing both impurity implantation regions into the third region, the intermediate region formed of a substantially parallel pn layer lower in impurity concentration than the first parallel pn layer can be formed between the first and second parallel pn layers. As the impurity concentration of the intermediate region is lower than the impurity concentration of the first parallel pn layer, the intermediate region is easier to deplete than the first parallel pn layer, and it is more difficult for electric field to concentrate in the intermediate region than in the first parallel pn layer. Consequently, as it is possible to adjust the respective charge balances of the first and second parallel pn layers, the breakdown voltage of the element peripheral portion is set to be higher than the breakdown voltage of the element active portion, thus facilitating a rise in the breakdown voltage of the whole element. Therefore, it is possible to improve reliability. Also, it is possible to improve avalanche resistance and reverse recovery resistance by setting the breakdown voltage of the element peripheral portion to be higher than the breakdown voltage of the element active portion.

Embodiment 2

Figure 14:
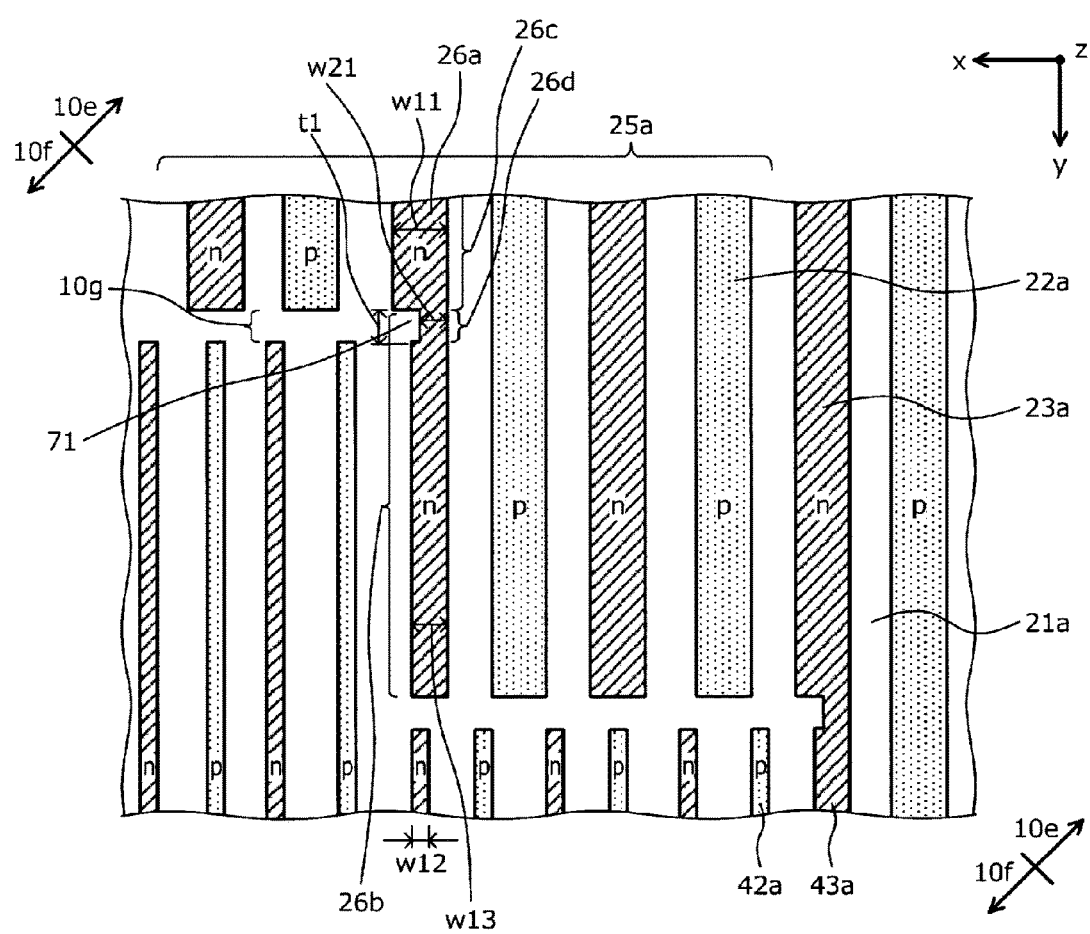
FIG. 14 is a plan view showing a condition of a semiconductor device according to Embodiment 2 in the process of being manufactured.

Next, a description will be given of a method of manufacturing a semiconductor device according to Embodiment 2. FIG. 14 is a plan view showing a condition of the semiconductor device according to Embodiment 2 in the process of being manufactured. In the method of manufacturing the semiconductor device according to Embodiment 2, the plan view shape of the impurity implantation regions (in FIG. 14, the n-type impurity implantation regions 23a) formed in the element active portion 10a by ion implantation is different from in the method of the semiconductor device according to Embodiment 1. Specifically, for example, an outer side portion in the second direction x of the narrow width portion (hereafter referred to as a first narrow width portion) 26b of the outermost impurity implantation region 26a of the stepped region 25a has a recess portion 71, thereby partially narrowing the width w13 of the first narrow width portion 26b.

A portion (hereafter referred to as a second narrow width portion) 26d of the first narrow width portion, which is set to be still narrower in width than the recess portion 71, is formed in the vicinity of the boundary with a portion (hereafter referred to as a wide width portion) 26c of the outermost impurity implantation region 26a which is wider in width than the first narrow width portion 26b. A width w21 of the second narrow width portion 26d is set to be narrower than the width w13 of the portion of the first narrow width portion 26b other than the second narrow width portion 26d, and wider than the width w12 of the n-type impurity implantation regions 43a (w12<w21<w13). Specifically, the width w21 of the second narrow width portion 26d is set to, for example, ½ of the width w11 of the outermost impurity implantation region 26a (the n-type impurity implantation region 23a) (w21=w11/2). A length t1 of the second narrow width portion 26d is the same as, for example, the width (the width w4 of the intermediate region 6) of the third region 10g.

As heretofore described, according to Embodiment 2, it is possible to obtain the same advantageous effects as in Embodiment 1.

Embodiment 3

Figure 15:
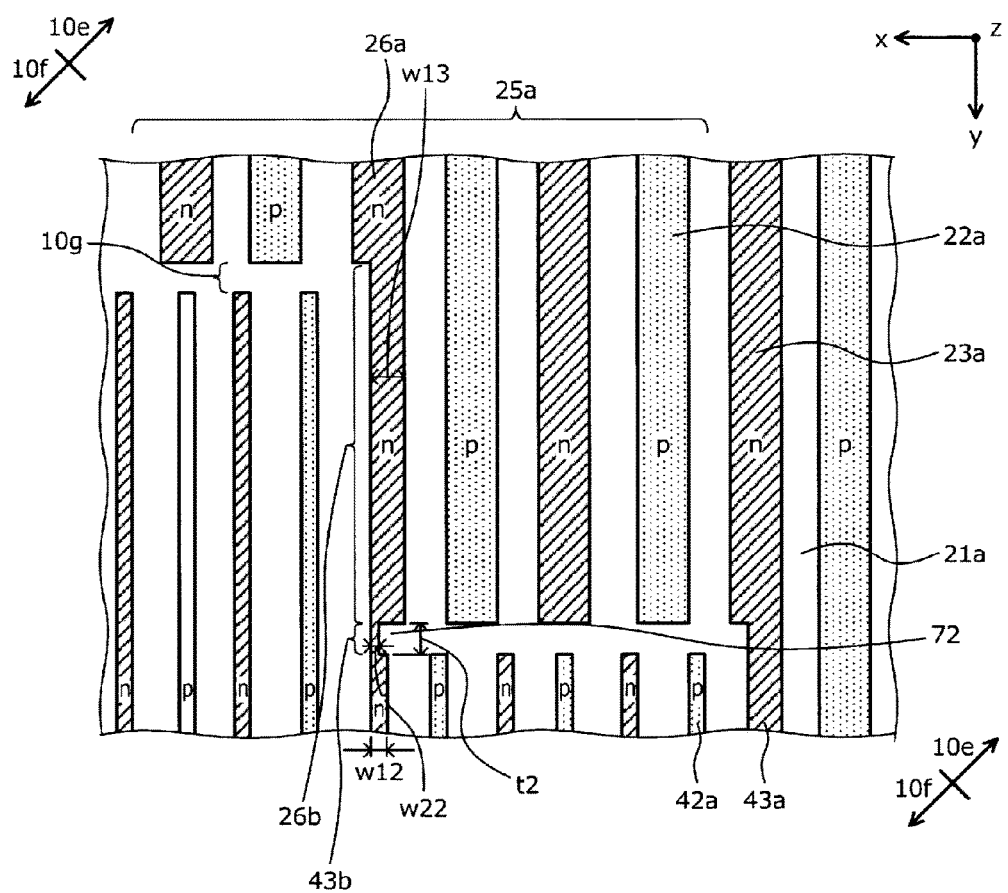
FIG. 15 is a plan view showing a condition of a semiconductor device according to Embodiment 3 in the process of being manufactured.
Figure 16A:
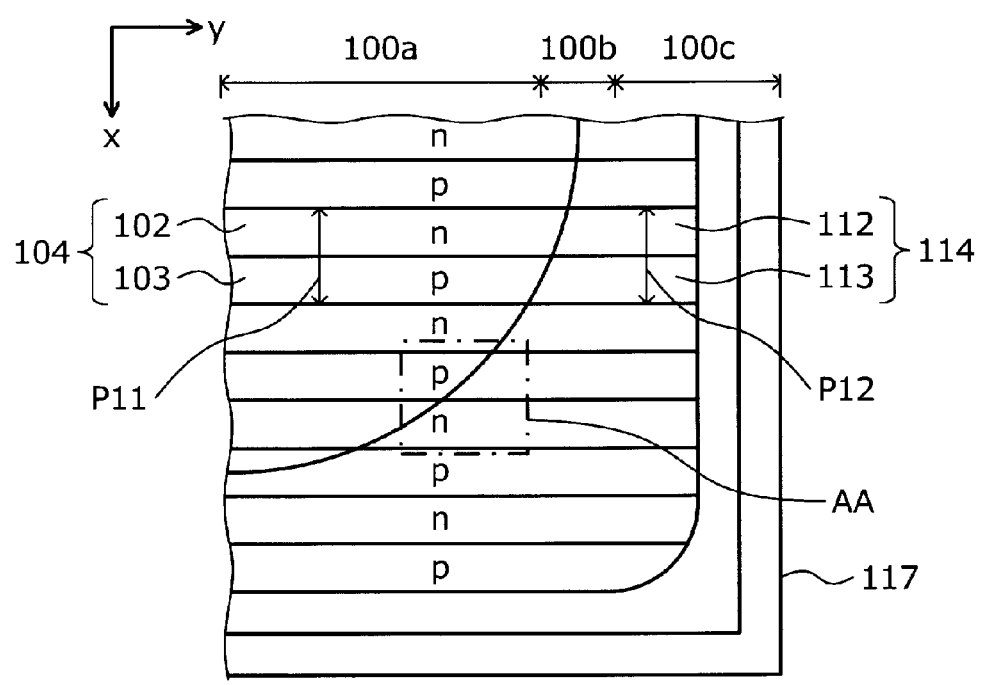
FIGS. 16A and 16B are plan views showing a plan view layout of a parallel pn layer of a heretofore known super junction semiconductor device.
Figure 16B:
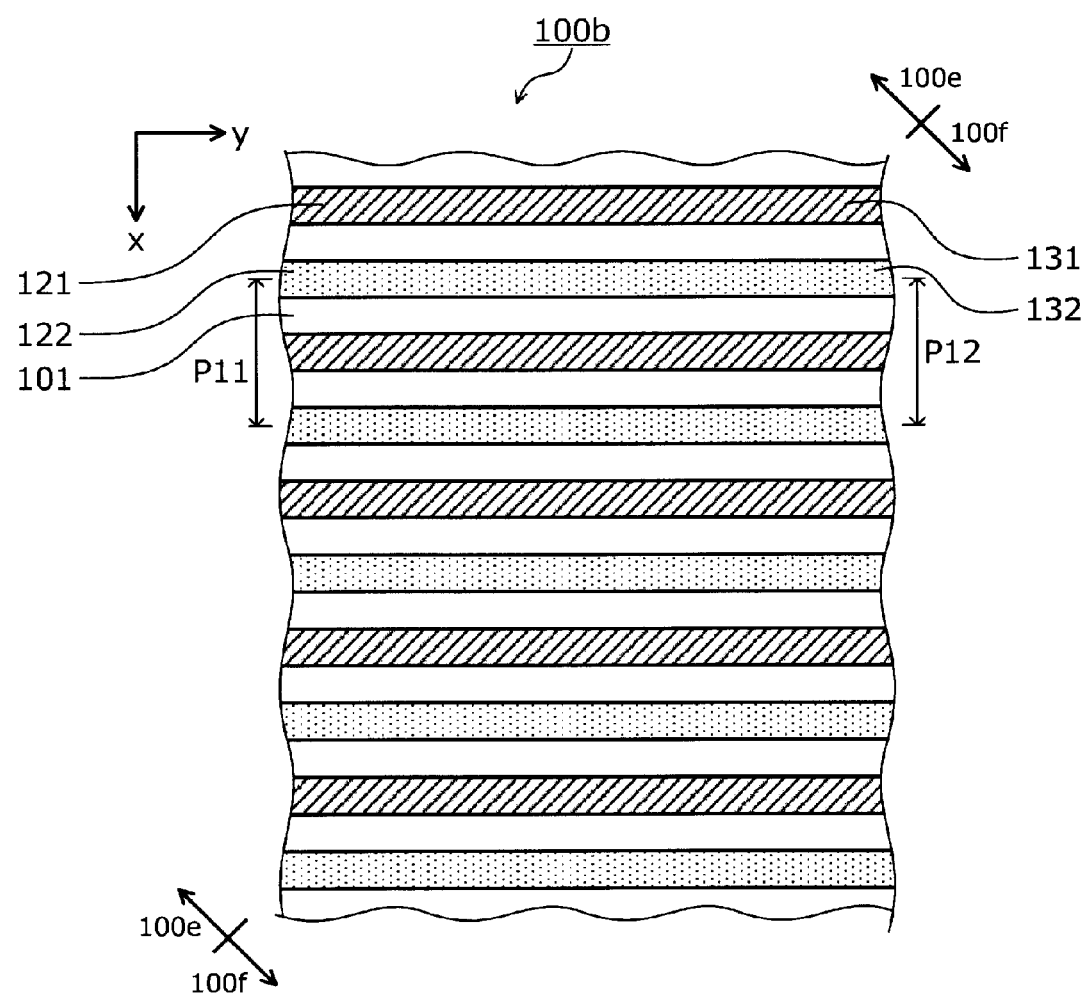
Figure 17A:
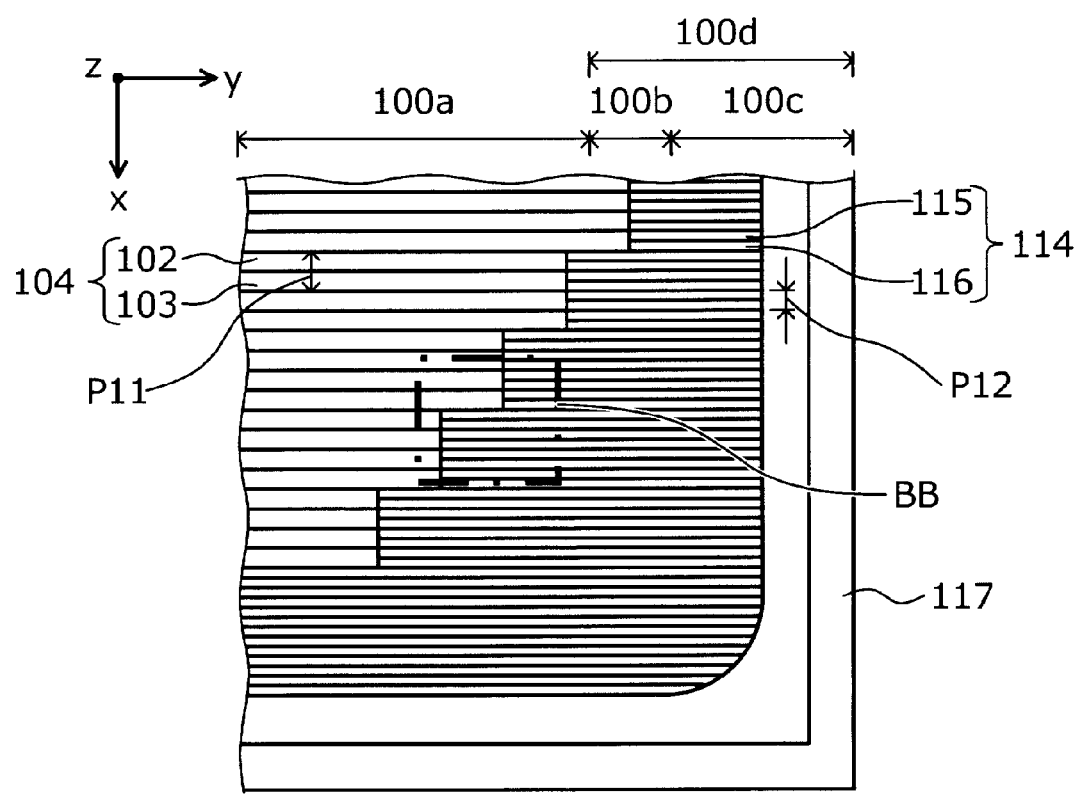
FIGS. 17A and 17B are plan views showing a plan view layout of the parallel pn layer of the heretofore known super junction semiconductor device.
Figure 17B:
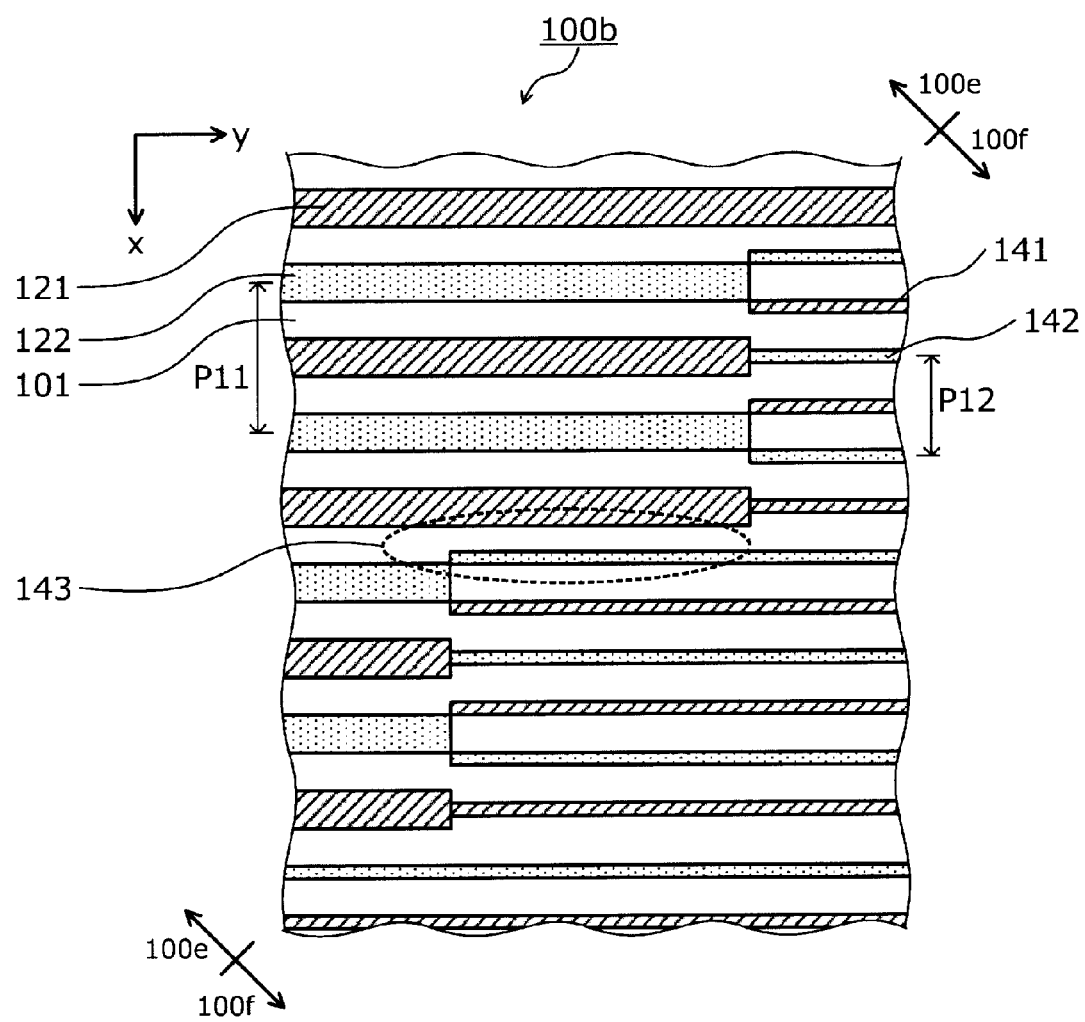

Next, a description will be given of a method of manufacturing a semiconductor device according to Embodiment 3. FIG. 15 is a plan view showing a condition of the semiconductor device according to Embodiment 3 in the process of being manufactured. In the method of manufacturing the semiconductor device according to Embodiment 3, the plan view shape of the impurity implantation regions 42a and 43a (in FIG. 15, the n-type impurity implantation regions 43a) formed in the breakdown voltage structure portion 10c by ion implantation is different from in the method of the semiconductor device according to Embodiment 1. Specifically, the width w12 of the n-type impurity implantation region 43a, opposed to the outermost impurity implantation region 26a of the stepped region 25a, which is the same in conductivity type as the outermost impurity implantation region 26a, is partially narrowed.

More specifically, the n-type impurity implantation regions 43a and the p-type impurity implantation regions 42a are disposed so that the outermost impurity implantation region 26a of the stepped region 25a is opposed in the first direction y to the n-type impurity implantation region 43a which is the same in conductivity type as the outermost impurity implantation region 26a. The n-type impurity implantation region 43a opposed to the outermost impurity implantation region 26a is disposed so as to be in contact in the first direction y with the first narrow width portion 26b of the outermost impurity implantation region 26a. Also, as the n-type impurity implantation region 43a opposed to the outermost impurity implantation region 26a has a recess portion 72 on the inner side in the second direction x, the width w12 of the n-type impurity implantation region 43a is partially narrowed.

A portion (hereafter referred to as a third narrow width portion) 43b of the n-type impurity implantation region 43a narrowed in width due to the recess portion 72 is formed in the vicinity of the boundary of the n-type impurity implantation region 43a with the outermost impurity implantation region 26a. The third narrow width portion 43b is continuous in contact in the first direction y with the first narrow width portion 26b of the outermost impurity implantation region 26a. A width w22 of the third narrow width portion 43b is, for example, ½ of the width w12 of the n-type impurity implantation regions 43a (w22=w12/2). A length t2 is the same as, for example, the width (the width w4 of the intermediate region 6) of the third region 10g.

As heretofore described, according to Embodiment 3, it is possible to obtain the same advantageous effects as in Embodiment 1.

In the above, the invention, not being limited to each heretofore described embodiment, can be variously modified without departing from the scope of the invention. For example, in each heretofore described embodiment, a description is given, as an example, of a case in which the outermost region of the stepped region is an n-type region, but the outermost region of the stepped region may be a p-type region. Also, the dimensions, impurity concentrations, and the like, described in each embodiment are examples, and the invention is not limited to the values thereof. Also, in each embodiment, the first conductivity type is n-type and the second conductivity type is p-type, but the invention holds equally true even when the first conductivity type is p-type and the second conductivity type is n-type. Also, the invention, not being limited to a MOSFET, can also be applied to an insulated gate bipolar transistor (IGBT), a bipolar transistor, a free wheeling diode (FWD), a schottky diode, or the like.

As above, the semiconductor device and semiconductor device manufacturing method according to the invention are useful for a high power semiconductor device including a breakdown voltage structure portion in an element peripheral portion encompassing an element active portion, and in particular, for a high voltage semiconductor device, such as a MOSFET, an IGBT, a bipolar transistor, an FWD, a schottky diode, or the like, with a drift layer as a parallel pn layer.

What is claimed is:

1. A semiconductor device, comprising:
a surface element structure provided on a side of a first principal surface of the semiconductor device;
a low resistance layer provided on a side of a second principal surface of the semiconductor device;
a first parallel pn layer provided between the surface element structure and the low resistance layer, the first parallel pn layer including first, first conductivity type regions and first, second conductivity type regions alternately disposed in a direction parallel to the first principal surface, in a plan view the first, first conductivity type regions and the first, second conductivity type regions being disposed to form stripes having longitudinal axes extending in a first direction, further in the plan view, the first parallel pn layer forms rectangle shapes having corner portions disposed in a stepwise arrangement so that a length, measured along the first direction, of the first, first conductivity type regions and the first, second conductivity type regions is shortened in steps;
a second parallel pn layer disposed to encompass the first parallel pn layer, the second parallel pn layer including second, first conductivity type regions and second, second conductivity type regions alternately disposed in the direction parallel to the first principal surface so as to be at a pitch narrower than a pitch of the first, first conductivity type regions and the first, second conductivity type regions; and
between the first parallel pn layer and the second parallel pn layer, an intermediate region including regions of different impurity concentrations from impurity concentrations of the first parallel pn layer and the second parallel pn layer,
wherein
the first, first conductivity type regions or the first, second conductivity type regions includes
a first portion, having a stepped shape, which is adjacent to the second, first conductivity type regions or the second, second conductivity type regions so as to be parallel to the first direction, and
a second portion opposed, in a second direction perpendicular to the first direction, to the second, second conductivity type regions or the second, first conductivity type regions, and
a width of the first portion in the second direction is narrower than a width of the second portion in the second direction.

2. The semiconductor device according to claim 1, wherein the first portion is adjacent to a region of the second, first conductivity type regions and the second, second conductivity type regions which is different in a conductivity type thereof from the first portion.

3. The semiconductor device according to claim 1, wherein the first portion includes a first part and a second part, the second part including a recess portion so that the second part is narrower in width in the second direction than a width of the first part.

4. The semiconductor device according to claim 1, wherein
in the first direction, the first portion is in contact with a connected region of the second, first conductivity type regions or the second, second conductivity type regions, the connected region being of a same conductivity type as a conductivity type of the first portion, and
the connected region includes a recessed part including a recess portion so that the recessed part is narrower in width along the second direction than a width of another portion of the connected region.

5. The semiconductor device according to claim 1, wherein the length, in the first direction, of the first, first conductivity type regions and the first, second conductivity type regions is shortened, at the corner portions of the first parallel pn layer, in steps repeatedly at increments of two or more of the first, first conductivity type regions and two or more of the first, second conductivity type regions.

6. The semiconductor device according to claim 1, wherein
in the plan view, the second, first conductivity type regions and the second, second conductivity type regions are disposed to form stripes having longitudinal axes orientated in the first direction.

7. The semiconductor device according to claim 1, the regions of different impurity concentrations of the intermediate region including:
third, first conductivity type regions and third, second conductivity type regions, disposed so as to be in contact with the first parallel pn layer, the third, first conductivity type regions being lower in average impurity concentration than an average impurity concentration of the first, first conductivity type regions, the third, second conductivity type regions being lower in average impurity concentration than an average impurity concentration of the first, second conductivity type regions; and
fourth, first conductivity type regions and fourth, second conductivity type regions, disposed so as to be in contact with the second parallel pn layer, the fourth, first conductivity type regions being lower in average impurity concentration than the second, first conductivity type regions, the fourth, second conductivity type regions being lower in average impurity concentration than the second, second conductivity type regions,
wherein the first portion is in contact with the second parallel pn layer in the second direction via the intermediate region.

8. The semiconductor device according to claim 1, further comprising:
an element active portion in which the surface element structure and the first parallel pn layer are disposed and through which current flows when in an on-state; and
an element peripheral portion in which the second parallel pn layer is disposed and which encompasses the element active portion.

* * * * *